US 9,231,374 B2

(12) United States Patent
Inoue et al.

(10) Patent No.: US 9,231,374 B2
(45) Date of Patent: Jan. 5, 2016

(54) MULTI-BEAM SEMICONDUCTOR LASER DEVICE

(71) Applicant: Oclaro Japan, Inc., Kanagawa (JP)

(72) Inventors: Yutaka Inoue, Nagano (JP); Hideki Hara, Nagano (JP); Shuichi Usuda, Nagano (JP)

(73) Assignee: USHIO OPTO SEMICONDUCTORS, INC., Tokyo (JP)

( * ) Notice: Subject to any disclaimer, the term of this patent is extended or adjusted under 35 U.S.C. 154(b) by 0 days.

(21) Appl. No.: 14/466,039

(22) Filed: Aug. 22, 2014

(65) Prior Publication Data

US 2015/0055670 A1    Feb. 26, 2015

(30) Foreign Application Priority Data

Aug. 23, 2013 (JP) .................. 2013-173112

(51) Int. Cl.
| | |
|---|---|
| *H01S 5/22* | (2006.01) |
| *H01S 5/343* | (2006.01) |
| *H01S 5/34* | (2006.01) |
| *H01S 5/40* | (2006.01) |
| *H01S 5/022* | (2006.01) |
| H01S 5/042 | (2006.01) |
| H01S 5/10 | (2006.01) |

(52) U.S. Cl.
CPC .............. *H01S 5/22* (2013.01); *H01S 5/0224* (2013.01); *H01S 5/02256* (2013.01); *H01S 5/343* (2013.01); *H01S 5/3407* (2013.01); *H01S 5/40* (2013.01); *H01S 5/4031* (2013.01); *H01S 5/02272* (2013.01); *H01S 5/0425* (2013.01); *H01S 5/1082* (2013.01)

(58) Field of Classification Search
CPC ......... H01S 5/0425; H01S 5/22; H01S 5/343; H01S 5/3407; H01S 5/40; H01S 5/02244; H01S 5/02256; H01S 5/4031; H01S 5/1082
See application file for complete search history.

(56) References Cited

U.S. PATENT DOCUMENTS

2005/0232324 A1    10/2005    Terada et al.
(Continued)

FOREIGN PATENT DOCUMENTS

| JP | 7-307522 A | 11/1995 |
|---|---|---|
| JP | 2005-223070 A | 8/2005 |
| JP | 2006-278694 A | 10/2006 |

(Continued)

OTHER PUBLICATIONS

Japanese Office Action received in corresponding Japanese Application No. 2013-173112 dated Oct. 13, 2015.

*Primary Examiner* — Armando Rodriguez
(74) *Attorney, Agent, or Firm* — Mattingly & Malur, PC

(57) ABSTRACT

Provided is a multi-beam semiconductor laser device in which deterioration of element characteristics is suppressed even when a beam pitch is reduced. The multi-beam semiconductor laser device includes: a first semiconductor multilayer in which a plurality of semiconductor layers are laminated; a plurality of light emitting ridge portions that are formed on the first semiconductor multilayer; a support electrode portion formed in a region between a pair of neighboring light emitting ridge portions; and a front ridge portion formed on the front side of the support electrode portion. The support electrode portion is electrically connected to one of the pair of neighboring light emitting ridge portions. The support electrode portion is higher than the one light emitting ridge portion. An end of the front ridge portion on the front end surface side is higher than the one light emitting ridge portion at the front end surface.

11 Claims, 16 Drawing Sheets

(56) References Cited

U.S. PATENT DOCUMENTS

2006/0222031 A1 10/2006 Inoue et al.
2007/0253457 A1 11/2007 Kashima et al.
2008/0291960 A1 11/2008 Inoue et al.
2009/0147816 A1 6/2009 Iga et al.
2011/0116526 A1 5/2011 Sorimachi et al.
2012/0189029 A1* 7/2012 Kashiwagi et al. ...... 372/44.011

FOREIGN PATENT DOCUMENTS

| JP | 2007-294732 A | 11/2007 |
| JP | 2008-294252 A | 12/2008 |
| JP | 2009-4524 A | 1/2009 |
| JP | 2009-141094 A | 6/2009 |
| JP | 2011-108932 A | 6/2011 |
| JP | 2012-124274 A | 6/2012 |

* cited by examiner

MULTI-BEAM SEMICONDUCTOR LASER DEVICE

CROSS-REFERENCE TO RELATED APPLICATION

The present application claims priority from Japanese application JP 2013-173112 filed on Aug. 23, 2013, the content of which is hereby incorporated by reference into this application.

BACKGROUND OF THE INVENTION

1. Field of the Invention

The present invention relates to a semiconductor laser element and a semiconductor laser device including the same, and more particularly, to a technology for reducing a beam pitch of a multi-beam semiconductor laser element.

2. Description of the Related Art

For instance, a semiconductor laser device used for a light source of an image printing apparatus such as a laser printer or a copying machine is equipped with a semiconductor laser element (laser chip) in which a light emitting portion is formed on a semiconductor substrate (hereinafter referred to simply as "substrate"). In particular, a multi-beam semiconductor laser element in which a plurality of light emitting portions are formed on a laser chip substrate has an advantage in that the number of scanning beams can be increased to perform high speed printing, and hence demands for the multi-beam semiconductor laser element have rapidly increased.

In view of cost reduction in a manufacturing process, it is desired that the multi-beam semiconductor laser element have a ridge structure. Depending on a semiconductor material used for a laser chip, it is necessary to enhance heat dissipation in order to suppress temperature rise in an active layer. As a mounting method for enhancing the heat dissipation, there is used a junction-down method involving bonding an upper surface of the laser chip (chip surface on a side closer to the active layer) to a submount (support substrate).

As a bonding material for bonding the semiconductor laser element and the submount, solder such as AuSn is usually used. However, because there is a difference in linear expansion coefficient between the semiconductor material of the laser chip and the submount material, thermal stress may occur when the device bonded at high temperature is rapidly cooled to room temperature. In this case, if the thermal stress is applied to the light emitting portion (or a waveguide section) of the semiconductor laser element, polarization property of a laser beam emitted from the semiconductor laser element is changed. As an example, it is known that a polarization plane of the emitted laser beam is rotated so that a polarization angle is increased. If the polarization angle of the laser beam is increased, when an optical component (lens or the like) having polarization angle dependence in optical characteristics is used, there occurs a malfunction such as a variation of a laser beam optical path or transmitted light intensity. JP 2006-278694 A discloses an optical semiconductor device in which uniformity of a reaction layer between a laser chip electrode material and a bonding material is enhanced so that a variation in a polarization direction is suppressed and good polarization property is achieved.

JP 2011-108932 A discloses a semiconductor optical device including a laser diode having a bank structure (bank portion 31) formed on right and left sides of a ridge structure (ridge portion 12). For instance, as illustrated in FIG. 1 of JP 2011-108932 A, a conductor is formed so that a height of an upper surface of the conductor (conductive layer 16) formed on an upper part of the bank portion 31 is higher than a height of an upper surface of the conductor (conductive layer 16) formed on an upper part of the ridge portion 12. Therefore, the bonding material (solder material 20) is melted and bonded to the conductor formed on the upper part of the bank portion 31. In contrast, the bonding material is separated away from the conductor formed on the upper part of the ridge portion 12 via an air gap so as not to be in contact with the conductor. Thus, polarization angle characteristics of the semiconductor optical device are stabilized.

SUMMARY OF THE INVENTION

In the multi-beam semiconductor laser element, a distance between neighboring light emitting portions is referred to as "beam pitch". For instance, in order to realize higher definition and higher resolution of a laser printer or a copying machine, it is desired to achieve a narrower beam pitch of the multi-beam semiconductor laser element serving as a light source.

The multi-beam semiconductor laser element having the ridge structure and the bank structure is examined. A ridge formed above the light emitting portion is referred to as "light emitting ridge portion". A pair of bank portions is formed on both sides of the light emitting ridge portion, and a unit of the light emitting ridge portion and the pair of bank portions is repeatedly arranged to realize the multi-beam semiconductor laser element for emitting multiple beams. In order to suppress cross talk generated between neighboring beams, it is desired to arrange an isolation trench between a bank portion of one unit and a neighboring bank portion of another unit. Further, by using the technology disclosed in JP 2011-108932 A, a height of an upper surface of a conductor formed on an upper part of one of the pair of bank portions is set to be larger than a height of an upper surface of a conductor formed on an upper part of the light emitting ridge portion. This multi-beam semiconductor laser element does not impair conductivity or heat dissipation and has stable polarization angle characteristics without requiring high positional accuracy in a step of mounting the laser chip on the submount.

In order to reduce the beam pitch, the inventors of the present invention studied a semiconductor laser device according to the related art described below. In a semiconductor laser element included in the semiconductor laser device according to the related art, the isolation trench arranged between neighboring bank portions is eliminated, and one of the pair of bank portions arranged on both sides of the light emitting ridge portion is not formed.

FIG. 16 is a cross-sectional view of the semiconductor laser element according to the related art. The semiconductor laser element according to the related art has a ridge structure. A plurality of light emitting portions 106 are formed on a laser chip substrate. The semiconductor laser device according to the related art is a multi-beam semiconductor laser device in which the semiconductor laser element according to the related art is mounted on a submount by the junction-down method. For simplicity, FIG. 16 illustrates two of the light emitting portions 106. In this case, the ridge formed above the light emitting portion 106 is a light emitting ridge portion 102, and a bank portion 103 is formed on the right of the light emitting ridge portion 102 in FIG. 16. A unit of the light emitting ridge portion 102 and one bank portion 103 is repeatedly arranged in order. From a front end surface to a rear end surface, the light emitting ridge portion 102 and the bank portion 103 have the structure illustrated in FIG. 16.

A semiconductor multilayered structure of the semiconductor laser element is illustrated in FIG. 16. In the light emitting ridge portion 102, a p-type clad layer 115 and a p-type contact layer 116 are laminated in order to have a predetermined width (light emitting ridge width), to thereby form the ridge. In the same manner, in the bank portion 103, the p-type clad layer 115 and the p-type contact layer 116 are laminated in order to have a predetermined width (bank width), to thereby form the ridge. An insulating oxide film 117 is formed to cover a surface of the semiconductor multilayer, but the insulating oxide film 117 is not formed on the upper surface of the p-type contact layer 116 of the light emitting ridge portion 102. A p-type electrode layer 118 is formed to cover the insulating oxide film 117 in a predetermined shape, and further a first thick film electrode 119 is formed on top of the p-type electrode layer 118. A second thick film electrode 120 is formed on the upper surface of the first thick film electrode 119 corresponding to the upper part of the bank portion 103. Note that, the second thick film electrode 120 is not formed on the upper part of the light emitting ridge portion 102. Therefore, a height of the upper surface of the conductor formed on the upper part of the bank portion 103 (upper surface of the second thick film electrode 120) is larger than a height of the upper surface of the conductor formed on the upper part of the light emitting ridge portion 102.

In view of conductivity and heat dissipation, in order that the second thick film electrode 120 formed on the upper part of the bank portion 103 be stably bonded to the submount via the bonding material, it is desired that the upper surface of the second thick film electrode 120 have a flat part of a predetermined width (or a predetermined area) or more. In order that the upper surface of the second thick film electrode 120 have a flat part of a predetermined width or more, it is necessary to secure a sufficient width of a semiconductor layer part of the bank portion 103 (bank width).

In the semiconductor laser element according to the related art, as the beam pitch becomes smaller, the bank width of the bank portion 103 becomes smaller accordingly. As a result, the flat part of the upper surface of the second thick film electrode 120 also becomes narrower (the area thereof is also decreased). Therefore, the conductivity and the heat dissipation are deteriorated, and bonding strength with the submount is also decreased.

The semiconductor laser element having the ridge structure has a simpler structure than other kinds of semiconductor elements, and hence has an advantage in that the number of steps in a multilayer growth process can be reduced. However, because the semiconductor laser element having the ridge structure has a simple structure, the light emitting ridge portion 102, which is important as a semiconductor laser function, is easily damaged mechanically due to handling or contact with a jig or tool in a manufacturing process. If the light emitting ridge portion, which is an important part having a role of guiding and amplifying the laser beam, is damaged, the laser cannot oscillate or is decreased in optical output.

The present invention has been made in view of the above-mentioned problems, and it is an object of the present invention to provide a semiconductor laser element and a semiconductor laser device in which deterioration of element characteristics is suppressed even when the beam pitch is reduced.

(1) In order to solve the above-mentioned problems, a semiconductor laser element according to one embodiment of the present invention includes: a first semiconductor multilayer in which a plurality of semiconductor layers including an active layer are laminated on a substrate; a plurality of light emitting ridge portions that are formed to extend along a light emitting direction from a front end surface to a rear end surface, and to be aligned in order on an upper surface of the first semiconductor multilayer along a direction orthogonal to the light emitting direction; a support electrode portion formed on the upper surface of the first semiconductor multilayer through intermediation of an insulating film in a region inside the front end surface and the rear end surface between a pair of neighboring ones of the plurality of light emitting ridge portions; and a front ridge portion formed on the upper surface of the first semiconductor multilayer on the front end surface side of the support electrode portion between the pair of neighboring ones of the plurality of light emitting ridge portions. The support electrode portion is electrically connected to one of the pair of neighboring ones of the plurality of light emitting ridge portions. A height of the support electrode portion is larger than a height of the one of the pair of neighboring ones of the plurality of light emitting ridge portions. A height of an end of the front ridge portion on the front end surface side is larger than a height of the one of the pair of neighboring ones of the plurality of light emitting ridge portions at the front end surface.

(2) The semiconductor laser element according to Item (1) may further include a rear ridge portion formed on the upper surface of the first semiconductor multilayer on the rear end surface side of the support electrode portion between the pair of neighboring ones of the plurality of light emitting ridge portions, and a height of an end of the rear ridge portion on the rear end surface side may be larger than a height of the one of the pair of neighboring ones of the plurality of light emitting ridge portions at the rear end surface.

(3) The semiconductor laser element according to Item (1) or (2) may further include an isolation trench formed in the upper surface of the first semiconductor multilayer between the pair of neighboring ones of the plurality of light emitting ridge portions.

(4) In the semiconductor laser element according to any one of Items (1) to (3), each of the plurality of light emitting ridge portions may include a first ridge semiconductor layer formed on the upper surface of the first semiconductor multilayer, and in the one of the pair of neighboring ones of the plurality of light emitting ridge portions, a height of the first ridge semiconductor layer at the front end surface may be smaller than a height thereof in an inner region.

(5) In the semiconductor laser element according to Item (4), in the one of the pair of neighboring ones of the plurality of light emitting ridge portions, an electrode formed above the first ridge semiconductor layer may be prevented from reaching the front end surface.

(6) In the semiconductor laser element according to Item (4), the front ridge portion may include a second ridge semiconductor layer formed on the upper surface of the first semiconductor multilayer, and a width of the second ridge semiconductor layer of the front ridge portion may be equal to or smaller than a width of the first ridge semiconductor layer of the one of the pair of neighboring ones of the plurality of light emitting ridge portions.

(7) In the semiconductor laser element according to any one of Items (1) to (6), a length of the support electrode portion may be 50% or more of a distance from the front end surface to the rear end surface.

(8) A semiconductor laser element according to another embodiment of the present invention may include: a first semiconductor multilayer in which a plurality of semiconductor layers including an active layer are laminated on a substrate; a plurality of light emitting ridge portions that are formed to extend along a light emitting direction from a front end surface to a rear end surface, and to be aligned in order on an upper surface of the first semiconductor multilayer along a direction orthogonal to the light emitting direction; a plurality of support electrode portions each formed on the upper surface of the first semiconductor multilayer through intermediation of an insulating film in a region inside the front end surface and the rear end surface between a pair of neighboring ones of the plurality of light emitting ridge portions; and a plurality of front ridge portions each formed on the upper surface of the first semiconductor multilayer on the front end surface side of each of the plurality of support electrode portions between the pair of neighboring ones of the plurality of light emitting ridge portions. Each of the plurality of support electrode portions may be electrically connected to one of a corresponding pair of the plurality of light emitting ridge portions. A height of each of the plurality of support electrode portions may be larger than a height of the one of the corresponding pair of the plurality of light emitting ridge portions. A height of an end of each of the plurality of front ridge portions on the front end surface side may be larger than a height of the one of the corresponding pair of the plurality of light emitting ridge portions at the front end surface.

(9) A semiconductor laser element according to another embodiment of the present invention may include: a first semiconductor multilayer in which a plurality of semiconductor layers including an active layer are laminated on a substrate; a plurality of light emitting ridge portions that are formed to extend along a light emitting direction from a front end surface to a rear end surface, and to be aligned in order on an upper surface of the first semiconductor multilayer along a direction orthogonal to the light emitting direction; an isolation trench portion formed in the upper surface of the first semiconductor multilayer in a region inside the front end surface and the rear end surface between a pair of neighboring ones of the plurality of light emitting ridge portions; and a front ridge portion formed on the upper surface of the first semiconductor multilayer on the front end surface side of the isolation trench portion between the pair of neighboring ones of the plurality of light emitting ridge portions. A height of an end of the front ridge portion on the front end surface side may be larger than a height of one of the pair of neighboring ones of the plurality of light emitting ridge portions at the front end surface.

(10) A semiconductor laser device according to another embodiment of the present invention may include the semiconductor laser element according to any one of Items (1) to (9).

According to one embodiment of the present invention, the semiconductor laser element and the semiconductor laser device are provided, in which deterioration of element characteristics is suppressed even when the beam pitch is reduced.

DETAILED DESCRIPTION OF THE INVENTION

Figure 1:
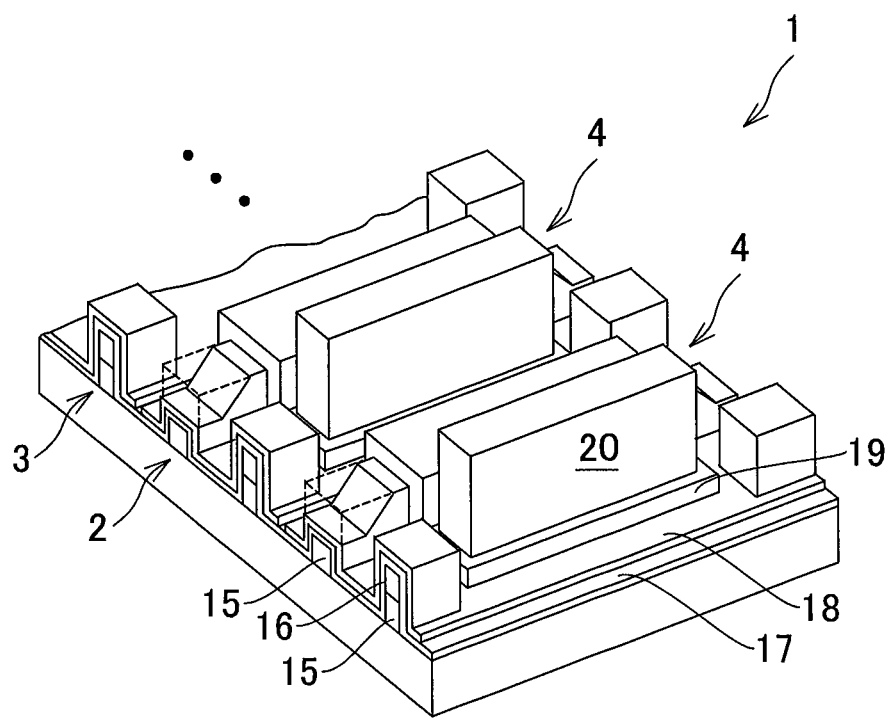
FIG. 1 is a perspective view illustrating a structure of a semiconductor laser element according to a first embodiment of the present invention.

Now, embodiments of the present invention are specifically described in detail with reference to the drawings. In all the drawings illustrating the embodiments, the parts having the same section, structure, and function are denoted by the same reference numeral or symbol as a rule, and overlapping description thereof is omitted. In addition, in the embodiments described below, description of the same or similar part is not repeated as a rule unless otherwise noted. In addition, the drawings are used merely for illustrating examples of the embodiment, and a scale in the drawing does not necessarily coincide with a scale in the description of the example.

First Embodiment

Figure 2:
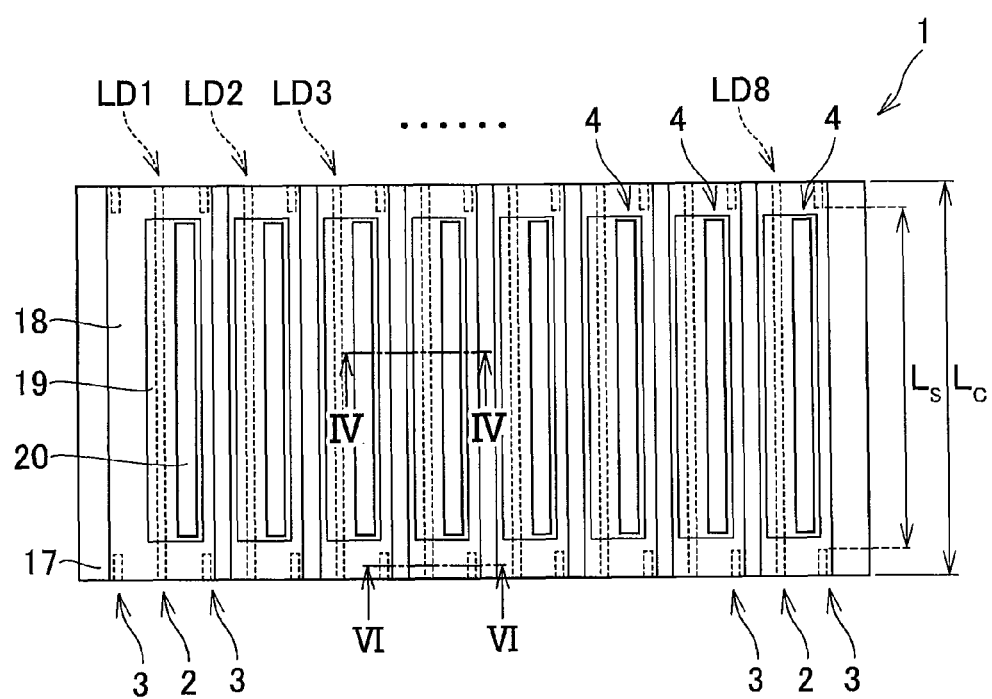
FIG. 2 is a top view illustrating the structure of the semiconductor laser element according to the first embodiment of the present invention.

FIG. 1 is a perspective view illustrating a structure of a semiconductor laser element 1 according to a first embodiment of the present invention, and FIG. 2 is a top view illustrating the structure of the semiconductor laser element 1 according to this embodiment. The semiconductor laser element 1 according to this embodiment is a multi-beam semiconductor laser element in 660 nm band including eight light emitting ridge portions 2, and a semiconductor laser device according to this embodiment includes the semiconductor laser element 1 according to this embodiment.

The semiconductor laser element 1 includes short ridge portions 3 close to individual LD facets on both sides. As used herein, the LD facets are end surfaces arranged at both ends of the light emitting ridge portion 2 extending in a vertical direction of FIG. 2. A front LD facet is an end surface on a signal light emitting side, and a rear LD facet is an end surface on a monitor light emitting side. Supposing that a distance between the LD facets on both sides is a resonator length Lc as illustrated in FIG. 2, the resonator length Lc is approximately 400 µm in this embodiment. Nine short ridge portions 3 (front ridge portions) are arranged in a vicinity of the front LD facet, and nine short ridge portions 3 (rear ridge portions) are arranged in a vicinity of the rear LD facet. The light emitting ridge portion 2 is arranged between a pair of (two) neighboring short ridge portions 3.

The semiconductor laser element 1 further includes eight support electrode portions 4. Each of the support electrode portions 4 is arranged on a side (right side in FIG. 2) of each light emitting ridge portion 2 and is electrically connected to an upper part of the corresponding light emitting ridge portion 2. Note that, JP 2012-124274 A discloses a semiconductor laser element including receiving parts on both sides of the ridge, but the receiving parts are arranged for protecting the ridge in cleavage, which is different from the present invention.

Figure 3:
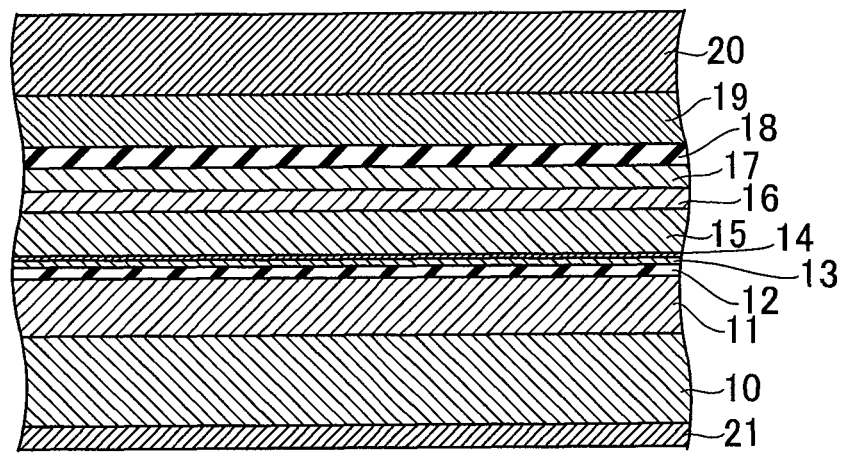
FIG. 3 is a cross-sectional view illustrating a film structure of the semiconductor laser element according to the first embodiment of the present invention.

FIG. 3 is a cross-sectional view illustrating a film structure (vertical structure) of the semiconductor laser element 1 according to this embodiment. An n-type clad layer 11, an active layer 12, a p-type clad layer 13 (p-type first clad layer), an etching stop layer 14, a p-type clad layer 15 (p-type second clad layer), and a p-type contact layer 16 are laminated in order on an n-type semiconductor substrate 10 (GaAs substrate). Those semiconductor layers are formed by crystal growth using a metal organic chemical vapor deposition (MOCVD) method, for example. Further, an insulating oxide film 17, a p-type electrode layer 18, a first thick film electrode 19, and a second thick film electrode 20 are formed in order. In addition, an n-type electrode layer 21 is formed on a back surface side (lower side in FIG. 3) of the n-type semiconductor substrate 10.

The n-type clad layer 11 is formed of an AlGaInP layer having a thickness of approximately 2.0 µm, for example. The active layer 12 is formed of a multi quantum well (MQW) structure in which a barrier layer that is an AlGaInP layer having a thickness of 5 nm and a well layer that is a GaInP layer having a thickness of 5 nm are alternately laminated, for example. The p-type clad layer 13 is formed of an AlGaInP layer having a thickness of 0.3 µm, and the p-type clad layer 15 is formed of an AlGaInP layer having a thickness of 1.5 µm, for example. In addition, the p-type contact layer 16 is formed of a GaAs layer having a thickness of 0.5 µm, for example. Further, a total thickness of the n-type semiconductor substrate 10 and those semiconductor layers is 50 µm to 100 µm, for example. In this case, the semiconductor layers from the n-type clad layer 11 to the etching stop layer 14 are referred to as "first semiconductor multilayer". An upper surface of the first semiconductor multilayer (upper surface of the etching stop layer 14) has a flat surface. The first semiconductor multilayer is laminated on the entire region of the upper surface of the n-type semiconductor substrate 10.

Figure 4:
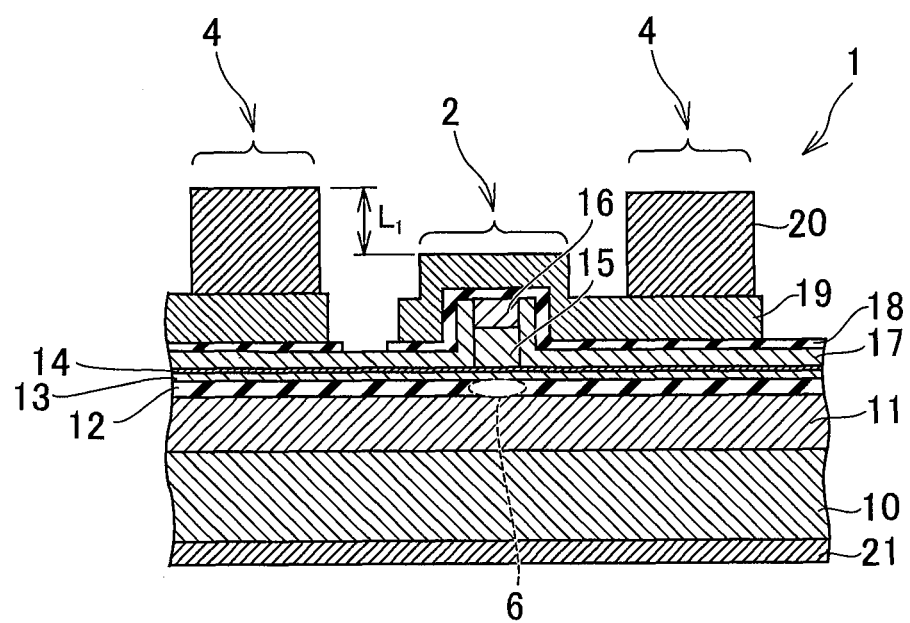
FIG. 4 is a cross-sectional view of the semiconductor laser element according to the first embodiment of the present invention.

FIG. 4 is a cross-sectional view of the semiconductor laser element 1 according to this embodiment taken along the line IV-IV of FIG. 2. On the upper surface of the first semiconductor multilayer (upper surface of the etching stop layer 14), there is formed a first ridge semiconductor layer including the p-type clad layer 15 and the p-type contact layer 16. The light emitting ridge portion 2 includes the first ridge semiconductor layer. Note that, the short ridge portion 3 (front ridge portion) arranged close to the front LD facet includes a second ridge semiconductor layer to be described later, and the short ridge portion 3 (rear ridge portion) arranged close to the rear LD facet includes a third ridge semiconductor layer to be described later. The first ridge semiconductor layer extends in a direction perpendicular to the facet plane (vertical direction in FIG. 2) with a predetermined width (light emitting ridge width) from the front LD facet to the rear LD facet, and has a protruding shape in cross section as illustrated in FIG. 4 with the first ridge semiconductor layer and the first semiconductor multilayer. The extending direction of the first ridge semiconductor layer (light emitting ridge portion 2) is the light emitting direction, and this direction is set as a resonator direction. Eight first ridge semiconductor layers are aligned in parallel to each other on the upper surface of the first semiconductor multilayer. In other words, the first ridge semiconductor layers are aligned in a plane serving as the upper surface of the first semiconductor multilayer along the direction orthogonal to the resonator direction (lateral direction in FIG. 2). Note that, as described later, the p-type contact layer 16 formed in the region in a predetermined distance from the front and rear LD facets is removed, and a height of the first ridge semiconductor layer in this region is smaller than a height of the first ridge semiconductor layer in other regions by the thickness of the p-type contact layer 16.

The insulating oxide film 17 is formed to cover the upper surface of the first semiconductor multilayer, the first ridge semiconductor layer, the second ridge semiconductor layer, and the third ridge semiconductor layer (details of the second ridge semiconductor layer and the third ridge semiconductor layer are described later). However, the insulating oxide film 17 formed in a region serving as the upper surface of the first ridge semiconductor layer is removed except for regions of the vicinities of the front and rear LD facets, and the insulating oxide film 17 is not formed. The insulating oxide film 17 is formed of a silicon oxide film formed by a CVD method, for example, and a thickness of the film is approximately 0.5 µm. Further, the p-type electrode layer 18 is formed into a predetermined shape so as to cover the upper surface of the first ridge semiconductor layer. Because the insulating oxide film 17 is not formed on the upper surface of the first ridge semiconductor layer, the p-type electrode layer 18 is held in contact with the p-type contact layer 16 as the top layer of the first ridge semiconductor layer, to thereby establish electric conductivity. The p-type electrode layer 18 is a Ti/Pt/Au layer, for example. As used herein, the symbol "/" means multilayered films laminated in order from left to right corresponding to the order from the substrate side. A total thickness of the multilayered films forming the p-type electrode layer 18 is approximately 0.5 µm.

The first thick film electrode 19 (first stage thick film electrode) is formed into a predetermined shape on the upper surface of the p-type electrode layer 18, and the second thick film electrode 20 (second stage thick film electrode) is formed into a predetermined shape on the upper surface of the first thick film electrode 19. Each of the first thick film electrode 19 and the second thick film electrode 20 is a gold layer formed by a plating method, for example. Thicknesses of the first thick film electrode 19 and the second thick film electrode 20 are approximately 2 µm and approximately 5 µm, respectively.

Each light emitting ridge portion 2 includes one first ridge semiconductor layer. An optical waveguide is formed in a region of the active layer 12 below the region in which the first ridge semiconductor layer is formed, to thereby emit signal light from the front LD facet. In this case, the region in the active layer 12 in which the optical waveguide is formed is a light emitting portion 6. With the eight light emitting ridge portions 2, the semiconductor laser element 1 functions as eight laser diodes that can be independently driven. FIG. 2 illustrates eight laser diodes LD1, LD2, LD3, ... LD8 in order from the left.

As illustrated in FIG. 2, when viewed from above, the predetermined shape of the p-type electrode layer 18 is a rectangular shape extending to both sides of the first ridge semiconductor layer. As to the seven laser diodes from the right side in FIG. 2 (LD2 to LD8), the predetermined shape includes regions of the first ridge semiconductor layer (light emitting ridge portion 2), and one second ridge semiconductor layer (front side) and one third ridge semiconductor layer (rear side) that are adjacent to the right side of the first ridge semiconductor layer in FIG. 2. Each of the front end and the rear end of the p-type electrode layer 18 reaches the LD facet. However, the predetermined shape does not include one second ridge semiconductor layer and one third ridge semiconductor layer that are adjacent to the left side of the first ridge semiconductor layer in FIG. 2. Further, the predetermined shape does not include the first ridge semiconductor layer adjacent to the right side of the first ridge semiconductor layer in FIG. 2. Note that, as to the laser diode (LD1) arranged at the leftmost in FIG. 2, the predetermined shape of the p-type electrode layer 18 further includes one second ridge semiconductor layer and one third ridge semiconductor layer that are adjacent to the left side of the first ridge semiconductor layer in FIG. 2.

As illustrated in FIG. 2, when viewed from above, the predetermined shape of the first thick film electrode 19 is a rectangular shape extending to both sides of the first ridge semiconductor layer and is included inside the predetermined shape of the p-type electrode layer 18. A front end of the first thick film electrode 19 is arranged further inside of an inner end of the second ridge semiconductor layer (short ridge portion 3). Similarly, a rear end of the first thick film electrode 19 is arranged further inside of an inner end of the third ridge semiconductor layer (short ridge portion 3). As illustrated in FIG. 2, when viewed from above, the predetermined shape of the second thick film electrode 20 is a rectangular shape extending along the resonator direction in parallel to the first ridge semiconductor layer on the right side of the first ridge semiconductor layer in FIG. 2, and is included inside the predetermined shape of the first thick film electrode 19. The second thick film electrode 20 is not formed on the upper part of the first ridge semiconductor layer. The electrode formed above the upper surface of the first ridge semiconductor layer serves as the p-type electrode layer 18 and the first thick film electrode 19 as illustrated in FIG. 4.

In general, the ridge means two types of structure: one is only a semiconductor layer formed into a ridge shape, and the other is a semiconductor layer and further a structure formed on the upper surface and both side surfaces of the semiconductor layer (insulating oxide film and electrode film). As used herein, a semiconductor layer formed into a ridge shape is referred to as "ridge semiconductor layer", and a structure including the film formed on the upper surface and both side surfaces of the ridge semiconductor layer is referred to as "ridge portion". In this case, the ridge semiconductor layer included in the light emitting ridge portion 2 is the first ridge semiconductor layer, and the light emitting ridge portion 2 is a part including, in addition to the first ridge semiconductor layer, the insulating oxide film 17, the p-type electrode layer 18, and the first thick film electrode 19 that are formed on the upper surface and both side surfaces of the first ridge semiconductor layer (the insulating oxide film 17 is not formed on the upper surface of the first ridge semiconductor layer). The height of the light emitting ridge portion 2 refers to a height of the upper surface of the structure formed on the first ridge semiconductor layer (in this case, the p-type electrode layer 18 and the first thick film electrode 19), namely, a height of the first thick film electrode 19. In addition, the width of the light emitting ridge portion 2 refers to a width of a part raised to have a protruding shape when the first thick film electrode 19 is formed above the first ridge semiconductor layer. However, as used herein, the formed insulating oxide film or electrode film is not always small enough compared with the height and width of the ridge semiconductor layer, and rather may be equal to or larger than the ridge semiconductor layer. In this case, even if the protruding shape of the ridge semiconductor layer is apparent, the entire shape of the ridge portion is not apparently protruding. Therefore, even if the height of the ridge portion is defined as the height of the upper surface of the structure formed on the ridge semiconductor layer, such as the insulating oxide film or the electrode film, the width of the ridge portion cannot be defined clearly. Therefore, when referring to the width of the ridge portion, the width of the ridge semiconductor layer included in the ridge portion may be used.

The region in which the second thick film electrode 20 is formed is a region inside the front LD facet and the rear LD facet of a pair of (two) neighboring first ridge semiconductor layers (light emitting ridge portions 2) (in this embodiment, further inside the inner ends of the second ridge semiconductor layer (front ridge portion) and the third ridge semiconductor layer (rear ridge portion)). The electrode formed in this region through intermediation of an insulating film on the first semiconductor multilayer is referred to as "support electrode portion 4". In other words, the support electrode portion 4 includes the p-type electrode layer 18, the first thick film electrode 19, and the second thick film electrode 20. Note that, the second thick film electrode 20 arranged on the right end in FIG. 2 is formed on the right side of the first ridge semiconductor layer (light emitting ridge portion 2) arranged on the right end in FIG. 2. In this region, the ridge is not formed, and the top surface of the semiconductor layer is the upper surface of the first semiconductor multilayer (upper surface of the etching stop layer 14) that is a flat surface. The support electrode portion 4 is formed on the upper surface of the first semiconductor multilayer through intermediation of the insulating oxide film 17. The support electrode portion 4 has a double plating structure including the first thick film electrode 19 and the second thick film electrode 20. With the p-type electrode layer 18 and the first thick film electrode 19, the support electrode portion 4 is electrically connected to the upper surface of the first ridge semiconductor layer on the left side in FIG. 4. In other words, the support electrode portion 4 is electrically connected to one of the neighboring pair of light emitting ridge portions 2 (on the left side in FIG. 4). The height of the support electrode portion 4 refers to a height of the upper surface of the second thick film electrode 20 as the top layer. Further, the thickness of the second thick film electrode 20 is approximately 5 μm and is larger than the thickness of the first ridge semiconductor layer. The height of the support electrode portion 4 is larger than the height of the (one) light emitting ridge portion 2 by a length $L_1$. In addition, because the support electrode portion 4 is formed on the upper surface of the first semiconductor multilayer as a flat surface, a sufficient flat part can be secured on the upper surface of the support electrode portion 4. Note that, the height of the light emitting ridge portion 2 is not constant along the resonator direction from the front LD facet to the rear LD facet. However, the height of the support electrode portion 4 and the height of the light emitting ridge portion 2 are compared at locations where the heights are largest.

Note that, because the p-type electrode layer 18, the first thick film electrode 19, and the second thick film electrode 20 have the shapes described above, the light emitting ridge portion 2 is not electrically connected to a neighboring light emitting ridge portion 2 (neighboring element (beam)) (is not short-circuited). In addition, the n-type electrode layer 21 (backside electrode) is a Ti/Pt/Au layer, for example, and the total thickness of the multilayered films forming the n-type electrode layer 21 is approximately 0.5 μm.

Figure 5:
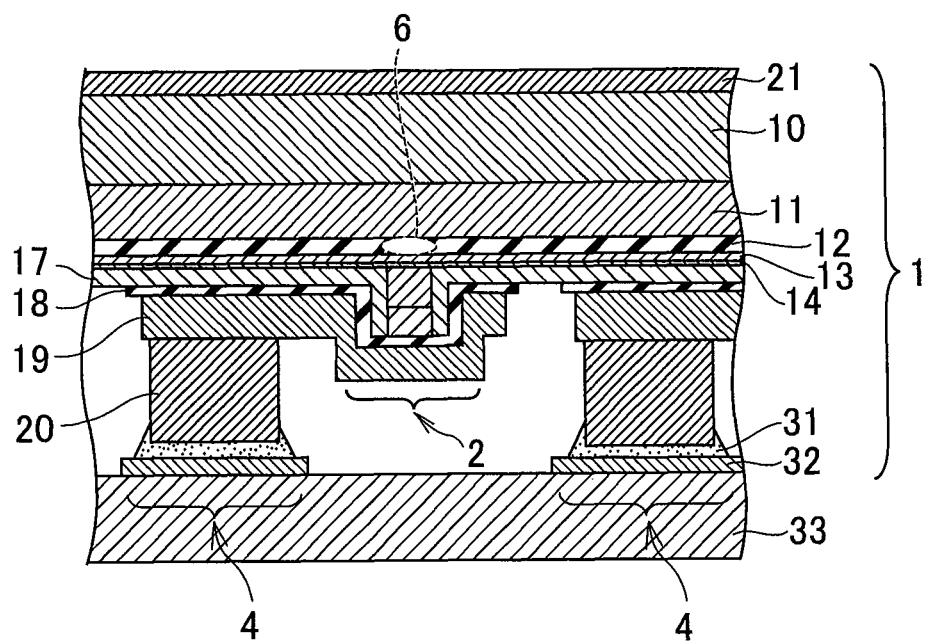
FIG. 5 is a cross-sectional view of a main part of a semiconductor laser device according to the first embodiment of the present invention.

FIG. 5 is a cross-sectional view of a main part of the semiconductor laser device according to this embodiment. The main part of the semiconductor laser device according to this embodiment includes a submount 33 (support substrate) and a semiconductor laser element 1 mounted on one surface of the submount 33 by the junction-down method. A cross section of the semiconductor laser element 1 illustrated in FIG. 5 is the same cross section as that of the semiconductor laser element 1 illustrated in FIG. 4 but is upside down to FIG. 4. It is desired that the submount 33 be made of a material having good thermal conductivity and a linear expansion coefficient similar to that of the material of the semiconductor substrate of the semiconductor laser element 1. In this case, the material of the submount 33 is AlN (having a linear expansion coefficient of $4.8 \times 10^{-6}$/K). Note that, the material of the n-type semiconductor substrate of the semiconductor laser element 1 is GaAs (having a linear expansion coefficient of $6.4 \times 10^{-6}$/K).

As illustrated in FIG. 5, a submount electrode 32 patterned into a predetermined shape is formed on a chip mount surface of the submount 33. The submount electrode 32 is a Ti/Pt/Au layer, for example, and is a multilayered film in which Ti/Pt/Au layers are laminated in order from the side closer to the substrate of the submount 33. On the submount electrode 32, a solder 31 for bonding, which is patterned into a predetermined shape, is formed. In this case, the solder 31 is made of AuSn, for example. The semiconductor laser element 1 is mounted on the submount 33 using the solder 31 by the junction-down method. The second thick film electrode 20 of the semiconductor laser element 1 is electrically connected to the submount electrode 32 of the submount 33 via the solder 31. Note that, the second thick film electrode 20 is not formed on the upper part of the light emitting ridge portion 2. As described above, the height of the support electrode portion 4 is larger than the height of the light emitting ridge portion 2, and a sufficient flat part is secured on the upper surface of the support electrode portion 4. Therefore, in a state where the semiconductor laser element 1 is solder-bonded to the submount 33, the light emitting ridge portion 2 is not bonded to the submount but is floating, whereas only the second thick film electrode 20 of the support electrode portion 4 is bonded. In other words, the support electrode portion 4 is an electrode for electrically connecting to the submount electrode 32 of the submount 33 and is a structure for physically supporting the semiconductor laser element 1 when the semiconductor laser element 1 is mounted on the submount 33. Therefore, with the support electrode portion 4, the bonding strength (shear strength) between the semiconductor laser element 1 and the submount 33 can be secured, and conductivity and heat dissipation can be secured. Further, mounting stress due to the submount bonding applied to the light emitting ridge portion 2, the active layer 12 (light emitting portion 6) positioned below the light emitting ridge portion 2 (above in FIG. 5), and the like can be reduced. Therefore, the polarization property of the semiconductor laser can be stabilized.

In general, the linear expansion coefficient is not equal between materials of the laser chip and the submount, and hence when the laser chip and the submount are bonded with solder, a stress is generated in accordance with a difference between a temperature when bonding is performed (near a melting point of the solder) and a temperature after cooling (room temperature). In general, electrodes of the light emitting ridges are bonded, and hence polarization property of the laser becomes unstable. In particular, the polarization angle (rotation of polarization plane of the laser beam) varies, and hence performance in use for a laser printer or a copying machine is deteriorated. In contrast, in the semiconductor laser device according to this embodiment, the electrode formed on the upper part of the light emitting ridge portion 2 of the semiconductor laser element 1 is not bonded on the submount 33 via the solder 31. As described above, the polarization property of the semiconductor laser can be stabilized.

Note that, if necessary, a barrier electrode structure for the solder 31 may be further laminated on the second thick film electrode 20. With this structure, the above-mentioned effect to reduce the stress is further enhanced so that the polarization property of the semiconductor laser can be further stabilized (see JP 2006-278694 A). In this case, the barrier electrode structure is a Ti/Pt/Au layer, for example, and is a multilayered film in which Ti/Pt/Au layers are laminated in order from the side closer to the second thick film electrode 20. Thicknesses of the layers are approximately 0.05 μm, approximately 0.3 μm, and approximately 0.1 μm, in order. Because this barrier electrode structure is formed, it is possible to suppress alloying or mutual melting (gold erosion) between the solder 31 (for example, AuSn) and the second thick film electrode 20 (for example, gold plating), which occurs in solder bonding. In the barrier electrode structure, only the thin Au layer reacts with the solder 31, but the Pt layer does not react therewith. Therefore, the solder material of the solder 31 is prevented from reaching the gold plating layer of the second thick film electrode 20. Therefore, the state of the solder bonding becomes more uniform in the bonding surface, and the generated stress also becomes more uniform.

Figure 6:
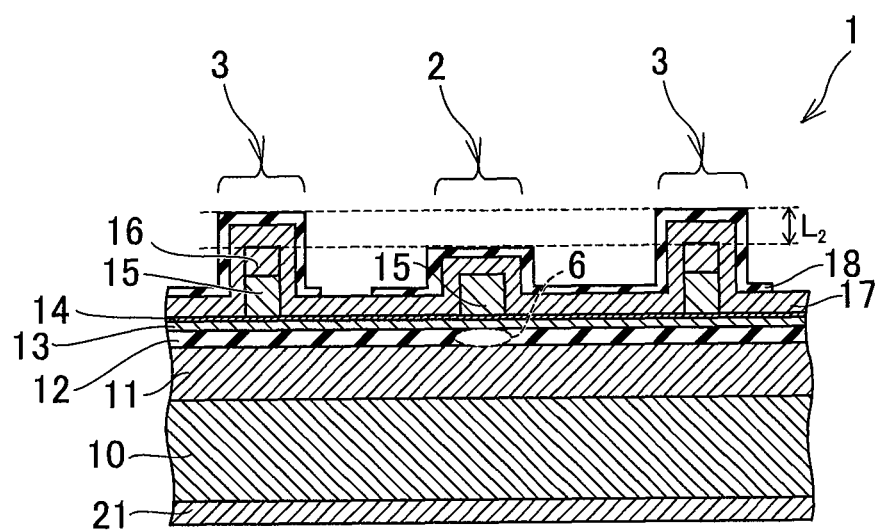
FIG. 6 is a cross-sectional view of the semiconductor laser element according to the first embodiment of the present invention.

FIG. 6 is a cross-sectional view of the semiconductor laser element 1 according to this embodiment and illustrates a cross section taken along the line VI-VI of FIG. 2. As illustrated in FIG. 2, the nine short ridge portions 3 are arranged near the front LD facet, and the nine short ridge portions 3 are arranged near the rear LD facet. Each of the short ridge portions 3 on the front side includes the second ridge semiconductor layer. The second ridge semiconductor layer is formed between a pair of (two) neighboring light emitting ridge portions 2 (first ridge semiconductor layers) on the front LD facet side of the front end of the support electrode portion 4. In the same manner, each of the short ridge portions 3 on the rear side includes the third ridge semiconductor layer. The third ridge semiconductor layer is formed on the upper surface of the first semiconductor multilayer between a pair of (two) neighboring light emitting ridge portions 2 (first ridge semiconductor layers) on the rear LD facet side of the rear end of the support electrode portion 4. Note that, in this embodiment, the second ridge semiconductor layer and the third ridge semiconductor layer are formed also on the outside of the light emitting ridge portions 2 (LD1 and LD8) on both ends. In this embodiment, the second ridge semiconductor layer and the third ridge semiconductor layer extend inward from the same position as the front and rear LD facets. In other words, ends of the second ridge semiconductor layer and the third ridge semiconductor layer on the LD facet side reach the LD facet.

As described above, the first ridge semiconductor layer (light emitting ridge portion 2) includes the p-type clad layer 15 and the p-type contact layer 16. However, in the region of a predetermined distance from the front and rear LD facets, the p-type contact layer 16 is removed by etching in a wafer process. Therefore, the first ridge semiconductor layer illustrated in FIG. 6 includes only the p-type clad layer 15. In this case, the predetermined distance is desirably in the range of from 10 μm to 30 μm, and is 25 μm in this embodiment. In addition, as described above, the insulating oxide film 17 is not formed in the region to be the upper surface of the first ridge semiconductor layer. However, in the region of a predetermined distance from the front and rear LD facets and in an inner region (for example, a region of 30 μm from the LD facet), the insulating oxide film 17 is not removed but formed on the upper surface of the first ridge semiconductor layer. As illustrated in FIG. 6, the insulating oxide film 17 is formed on the upper surface of the first ridge semiconductor layer (upper surface of the p-type clad layer 15). Further, as described above, the p-type electrode layer 18 is formed on the upper surface of the insulating oxide film 17.

In contrast, the second ridge semiconductor layer and the third ridge semiconductor layer each include the p-type clad layer 15 and the p-type contact layer 16 (FIG. 6) similarly to the first ridge semiconductor layer illustrated in FIG. 4. In other words, unlike the structure of the first ridge semiconductor layer near the facet, the p-type contact layer 16 is not removed in the second ridge semiconductor layer and the third ridge semiconductor layer, but the p-type contact layer 16 is formed in the entire region of the short ridge portion 3. Further, the insulating oxide film 17 is formed on the upper surfaces of the second ridge semiconductor layer and the third ridge semiconductor layer (upper surface of the p-type contact layer 16). Further, as described above, the p-type electrode layer 18 is formed on the upper surface of the insulating oxide film 17.

As illustrated in FIG. 6, the p-type contact layer 16 is removed from the first ridge semiconductor layer, and the height of the first ridge semiconductor layer at the LD facet is smaller than the inner region (in which the p-type contact layer 16 is not removed). At the front LD facet, the height of the short ridge portion 3 is larger than the height of the light emitting ridge portion 2 by a length $L_2$. In other words, at the front LD facet, the height of the structure formed above the second ridge semiconductor layer (upper surface of the p-type electrode layer 18) is larger than the height of the structure formed above the first ridge semiconductor layer (upper surface of the p-type electrode layer 18) by the length $L_2$. In this case, the length $L_2$ corresponds to the thickness of the p-type contact layer 16. FIG. 1 illustrates a case where the p-type contact layer 16 is not removed near the front LD facet by a broken line, so as to clearly indicate the light emitting ridge portion 2 whose height is decreased when the p-type contact layer 16 is removed. Note that, similarly at the rear LD facet, the height of the short ridge portion 3 is also larger than the height of the light emitting ridge portion 2 by the length $L_2$. In other words, at the rear LD facet, the height of the structure formed above the third ridge semiconductor layer (upper surface of the p-type electrode layer 18) is larger than the height of the structure formed above the first ridge semiconductor layer (upper surface of the p-type electrode layer 18) by the length $L_2$.

At the LD facet, because the height of the short ridge portion 3 is larger than the height of the light emitting ridge portion 2, damage to the light emitting ridge portion 2 due to contact with a jig or tool or due to handling in a manufacturing process can be suppressed. In particular, it is a problem that the light emitting ridge portion 2 is apt to be damaged in a step of dividing the wafer into bars after the wafer process and coating the division surface (facet plane of the laser) with a reflection film. In this step, handling is performed to arrange a plurality of semiconductor laser elements 1 cleaved into bars so that the facet planes face upward. Accordingly, a flat plane of the jig to be an arrangement table and the upper part of the light emitting ridge portion 2 contact with each other when the bar is inclined. In this case, a risk of mechanical damage to the light emitting ridge portion 2 is increased, but the short ridge portion 3 suppresses the damage.

In the multi-beam semiconductor laser element, if even one of the plurality of beams does not oscillate or causes a decrease in optical output, the multi-beam semiconductor laser element (semiconductor laser device) becomes a defective, and defect rates of beams are accumulated to affect a manufacturing yield. Therefore, the manufacturing yield is greatly reduced so that cost is increased. However, because the present invention can suppress the mechanical damage to the light emitting ridge portion 2, the manufacturing yield of the elements (devices) can be improved.

Note that, in the light emitting ridge portion 2 near the LD facet, even if the p-type contact layer 16 is removed and the insulating oxide film 17 remains, there is no problem in characteristics of the semiconductor laser. It is because in the semiconductor laser having the ridge structure, a current supplied from the electrode to a contact layer expands along with diffusion of carriers thereof, and is distributed to the active layer part to such an extent that the function of the laser is not adversely affected. Rather, because the carrier density near the facet plane is decreased, life deterioration due to facet plane deterioration caused by supply of electricity can be prevented. Thus, a remarkable effect of high reliability and long life of the laser can be obtained.

The semiconductor laser element 1 according to this embodiment and the semiconductor laser device including the semiconductor laser element 1 are described above. In the semiconductor laser element 1, a predetermined voltage is applied between the p-type electrode of each light emitting ridge portion 2 and the n-type electrode as a common electrode. Then, in the active layer 12 (light emitting portion 6) below the light emitting ridge portion 2, laser oscillation of light having a predetermined wavelength (for example, red color light of 660 nm) is performed. The laser beam is emitted externally from the LD facet orthogonal to the resonator direction of the light emitting ridge portion 2.

Main features of the semiconductor laser element 1 according to this embodiment are as follows. A first feature is that the short ridge portions 3 are arranged near the front and rear LD facets between the pair of neighboring light emitting ridge portions 2. At the LD facet, the height of the short ridge portion 3 is larger than the height of the light emitting ridge portion 2 so that mechanical damage to the light emitting ridge portion 2 can be suppressed. Note that, the height of the short ridge portion 3 is larger than the height of both of the pair of neighboring light emitting ridge portions 2, and it should be understood that the height of the short ridge portion 3 at the LD facet is larger than the height of one of the pair of light emitting ridge portions 2 which is electrically connected to the support electrode portion 4. In addition, the short ridge portion 3 is simultaneously formed by the manufacturing method and process common to the light emitting ridge portion 2 in the wafer process as described later. Therefore, the above-mentioned effect can be obtained while suppressing an increase in number of steps.

Figure 16:
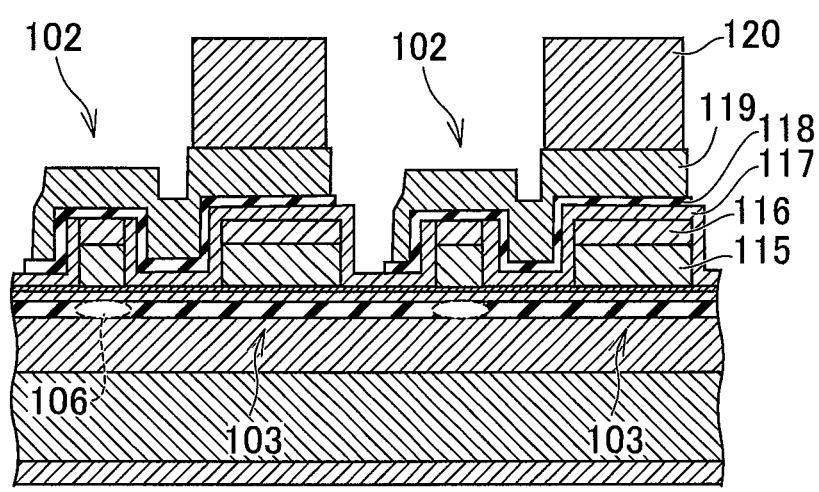
FIG. 16 is a cross-sectional view of a semiconductor laser element according to a related art.

A second feature is that the support electrode portion 4 is arranged between the neighboring light emitting ridge portions 2 so as to be electrically connected to one of the light emitting ridge portions 2. The light emitting ridge portion 2 is formed to extend in an oscillator direction from the front LD facet to the rear LD facet. In the oscillator direction, the length of the short ridge portion 3 is smaller than the length of the light emitting ridge portion 2 (length Lc of the resonator illustrated in FIG. 2). Therefore, when the short ridge portion 3 is arranged, a region (vacant space) in which the upper surface of the semiconductor multilayer expands as a flat surface can be formed between the neighboring light emitting ridge portions 2. Note that, a length of this region is denoted by Ls. In other words, in this region, the upper surface of the semiconductor multilayer is the upper surface of the first semiconductor multilayer (upper surface of the etching stop layer 14) and is a flat surface. Then, because the support electrode portion 4 can be arranged in the region, even if the beam pitch (beam interval) of the multi-beam semiconductor laser element is made smaller, a sufficient flat part can be secured on the upper surface of the support electrode portion 4. The height of the support electrode portion 4 is larger than the height of the light emitting ridge portion 2. As described above, when the semiconductor laser element 1 is mounted on the submount 33 by the junction-down method, the polarization property of the semiconductor laser can be stabilized. If the beam pitch is 40 µm or less, particularly 30 µm or less, it becomes difficult to secure a sufficient flat surface in the bonding region with the submount in the structure of the semiconductor laser element illustrated in FIG. 16. Therefore, the present invention can provide a remarkable effect.

In general, when the beam pitch is reduced, an electrode interval and an electrode width on the laser chip mounting side are decreased. In addition, intervals and widths of pattern shapes of submount electrodes and solders formed on the submount are decreased. In this case, when the laser chip is mounted on the submount, the laser chip and the submount need to be positioned so that the electrode pattern shape of the laser chip and the pattern shape of the submount electrode as well as the solder of the submount are aligned with each other. Because the interval and width of the pattern shape are decreased, high accuracy of alignment is necessary. When a misalignment occurs in the bonding part, an electrical short circuit with a neighboring light emitting ridge portion may occur. In addition, it is known that the polarization angle of the laser beam is increased when the mounting stress (particularly, shear stress) applied to the light emitting ridge portion is increased (see JP 2009-141094 A). The misalignment of the bonding part deteriorates the characteristics of the semiconductor laser element. If alignment accuracy is increased for suppressing the misalignment, cost is increased. However, in the semiconductor laser element 1 according to this embodiment, by securing a sufficient flat part on the upper surface of each support electrode portion 4, the alignment can be performed more easily. Thus, the semiconductor laser element having desired characteristics can be manufactured while the need of increasing alignment accuracy is suppressed.

In order to secure sufficient bonding strength (shear strength) between the semiconductor laser element 1 and the submount 33, and to secure sufficient conductivity and heat dissipation, it is desired to set the length of the support electrode portion 4 in the resonator direction to be 50% or more of the resonator length Lc. In other words, it is desired to set a distance Ls (vacant space length) between inner ends (opposite to the LD facet side ends) of the front short ridge portion 3 (second ridge semiconductor layer) and the rear short ridge portion 3 (third ridge semiconductor layer) to be 50% or more of the resonator length Lc. Therefore, it is desired to set the length of the short ridge portion 3 (second ridge semiconductor layer or third ridge semiconductor layer) to be 25% or less of the resonator length Lc. In addition, in order to secure structural stability, it is desired to set the length of the short ridge portion 3 (second ridge semiconductor layer or third ridge semiconductor layer) to be equal to or larger than the width of the short ridge portion 3 (second ridge semiconductor layer or third ridge semiconductor layer). When the resonator length Lc is approximately 400 µm and the width of the second ridge semiconductor layer (third ridge semiconductor layer) is approximately 1 µm, it is desired that the length of the second ridge semiconductor layer (third ridge semiconductor layer) be in the range of from 1 µm to 100 µm.

In view of suppressing mechanical damage to the light emitting ridge portion 2, it is desired to arrange the short ridge portion 3 on each of the front side and the rear side, but this structure is not a limitation. If a more vacant space is necessary for the support electrode portion 4, for example, the short ridge portion 3 may be arranged only on the front side. It is because light emitted from the rear LD facet is used for monitoring and has little influence as a semiconductor laser. In this case, the region from the inner end of the short ridge portion 3 (front ridge) to the rear LD facet is the region (vacant space) for arranging the support electrode portion 4, and hence it is desired to set the distance Ls (vacant space length) from the inner end of the short ridge portion 3 to the rear LD facet to be 50% or more of the resonator length Lc, and it is desired to set the length of the short ridge portion 3 (second ridge semiconductor layer) to be 50% or less of the resonator length. In other words, when the short ridge portion 3 is arranged only on the front side, the length of the short ridge portion 3 can be increased more. When the resonator length Lc is approximately 400 µm and the width of the second ridge semiconductor layer is approximately 1 µm, it is desired to set the length of the second ridge semiconductor layer to be in the range of from 1 µm to 200 µm.

In the multi-beam semiconductor laser element, when the beam pitch is reduced, a distance (interval) between neighboring light emitting ridge portions 2 is also decreased. As a result, the length that can be secured in the lateral width of the support electrode portion 4 is also decreased. In addition, the widths of the short ridge portions 3 (width of the second ridge semiconductor layer and width of the third ridge semiconductor layer) are also decreased. Unlike the bank portion 103 of the semiconductor laser element illustrated in FIG. 16, the short ridge portion 3 does not contribute to the bonding with the submount. Under a condition in which the structural stability is secured, when the beam pitch is reduced, the width of the short ridge portion 3 can be decreased. In other words, not only in the case where the width of the short ridge portion 3 is larger than the width of the light emitting ridge portion 2 but also in the case where the width of the short ridge portion 3 is equal to or smaller than the width of the light emitting ridge portion 2, the semiconductor laser element according to the present invention can be realized, and the beam pitch can be reduced more as a remarkable effect. In other words, when the width of the first ridge semiconductor layer as a semiconductor part of the light emitting ridge portion 2 is approximately 1.5 µm to 2.0 µm, the width of the second ridge semiconductor layer (third ridge semiconductor layer) as a semiconductor part of the short ridge portion 3 can be set equal to or smaller than the width of the first ridge semiconductor layer. For instance, the width of the second ridge semiconductor layer (third ridge semiconductor layer) can be set as small as approximately 1 µm, for example.

In order to realize higher definition and higher resolution of a laser printer or a copying machine, it is desired to reduce the beam pitch as described above. It is because as the beam pitch becomes smaller, a scanning interval of a spot formed on a photosensitive drum of the copying machine can be made smaller. Therefore, the present invention is suitable for a multi-beam semiconductor laser device used as a light source in the laser printer or the copying machine. In order to realize higher definition and higher resolution of the laser printer or the copying machine, it is also desired to reduce the wavelength of light emitted from the semiconductor laser element (oscillation wavelength). It is because when the laser beam is condensed by a lens, as the wavelength becomes shorter, a beam spot diameter can be made smaller, and hence higher definition can be achieved. In order to realize a shorter wavelength of the multi-beam semiconductor laser element, a material suitable for the wavelength needs to be selected as a semiconductor material used for the active layer and the clad layer of the semiconductor laser element. As an example, a GaAs/AlGaAs-based material is used for the semiconductor laser element in 780 nm band. In contrast, as described above, a GaInP/AlGaInP-based material is used for the semiconductor laser element in 660 nm band having a shorter wavelength than the 780 nm band. This semiconductor material has high dependence on temperature in semiconductor physical characteristics such as a threshold current as compared with materials used for the semiconductor laser element in 780 nm band, and is a material that is disadvantageous in terms of temperature characteristics. However, the present invention provides the remarkable effect of securing conductivity and heat dissipation and hence is suitable for achieving a shorter oscillation wavelength.

Note that, a thick film electrode may be formed also on the upper part of the short ridge portion 3 (above the second ridge semiconductor layer and above the third ridge semiconductor layer). When the thick film electrode is formed on the short ridge portion 3, mounting stress applied to the light emitting portion 6 and the like can be reduced as a remarkable effect. In this case, it is desired that the height of the support electrode portion 4 be substantially equal to the height of the short ridge portion 3 (height of the thick film electrode). For this purpose, the support electrode portion 4, the short ridge portion 3, and the thick film electrode are formed in different steps. In other words, the step of forming the thick film electrode layer (gold plating layer) (photolithography of the plating pattern and plating formation) is performed three times in total for the first thick film electrode 19, the second thick film electrode 20, and the thick film electrode to be formed on the short ridge portion 3. The thick film electrode to be formed on the upper part of the short ridge portion 3 may be a single stage structure.

The present invention has the feature of the structure between two neighboring light emitting ridge portions 2 for achieving a smaller beam pitch. The front ridge portion and the rear ridge portion (short ridge portion 3) may not be arranged on the left end illustrated in FIG. 2 (left side of the laser diode LD1) and may be replaced with a bank structure. In the same manner, the support electrode portion 4 on the right end (laser diode LD8) illustrated in FIG. 2 is not always required to be formed in the vacant space. For instance, the front ridge portion and the rear ridge portion arranged on the right end may be replaced with a bank structure so as to form the thick film electrode on the bank ridge like the bank portion 103 illustrated in FIG. 16.

Now, a method of manufacturing the semiconductor laser element 1 according to this embodiment is described. First, a wafer (n-type semiconductor substrate 10) made of n-type GaAs having a thickness of approximately 500 μm is prepared. The n-type clad layer 11, the active layer 12, the p-type clad layer 13, the etching stop layer 14, the p-type clad layer 15, and the p-type contact layer 16 are laminated and formed in order on the wafer by a crystal growth method such as MOCVD. Next, by using an ordinary semiconductor wafer process, the p-type contact layer 16 in the region of a predetermined distance from the facet in the region serving as the light emitting ridge portion 2 is removed. Then, the oxide film is formed on the entire surface of the wafer as preparation for forming the first ridge semiconductor layer (light emitting ridge portion 2) and the second ridge semiconductor layer and the third ridge semiconductor layer (short ridge portion 3). The oxide film is patterned by using the photolithography and etching process. Along the pattern, the semiconductor crystal part (p-type clad layer 15 and p-type contact layer 16) is etched and patterned. Thus, the first ridge semiconductor layer, the second ridge semiconductor layer, and the third ridge semiconductor layer are formed.

Next, the insulating oxide film 17 is formed on the entire surface of the wafer, and the insulating oxide film 17 formed in the region serving as the upper surface of the first ridge semiconductor layer (light emitting ridge portion 2) is removed by photolithography and etching so that the p-type contact layer 16 in the region is exposed. Then, the p-type electrode layer 18 is formed into a predetermined shape on the entire surface of the wafer. Next, the first thick film electrode 19 and the second thick film electrode 20 are formed into predetermined shapes by the gold plating method.

In this case, the gold plating is patterned by the following method. By the photolithography process, a photoresist is opened for the region for forming the gold plating. In this state, a plating power supply pin is made to contact with the p-type electrode layer 18 remaining to edge a periphery of the wafer, and a predetermined current is supplied in the plating liquid. Thus, the gold plating layer is deposited and formed only in the photoresist opening portion on the electrode pattern of the p-type electrode layer 18 as a base electrode. The thickness of the film can be accurately controlled by the supplied current and supplying time. Note that, this method is an ordinary electroplating method, but other methods may be used. For instance, an ordinary electroless plating method may be used. When the barrier electrode structure is formed on the second thick film electrode 20, the barrier electrode structure is formed by a vacuum deposition method, for example, after the gold plating is formed. In this way, a p-side process is completed.

Next, an n-side process is described. The wafer is fixed to a support plate such as a glass plate with an adhesive such as wax in a state where a device surface (here, p-side) of the wafer faces downward. Then, the backside (here, n-side) of the wafer is ground so that the wafer has a predetermined thickness. The predetermined thickness is 50 μm to 100 μm, for example.

The support plate to which the wafer is fixed is heated so that the wax is softened and is peeled from the support plate. Next, the n-type electrode layer 21 is deposited, and is patterned. Then, a thermal process (alloying) is performed for alloying the semiconductor crystal and the electrode material. Thus, the wafer process is completed. Note that, after the n-type electrode layer 21 is formed, a thick film electrode may be formed also on the n-side. This can obtain the effect of canceling warp generated in the wafer or the chip by preventing the formation of a thick film structure having an extremely large number of layers on the p-side.

Next, a process of separating chips from the wafer is performed. First, the completed wafer is cleaved into bars elongated in a lateral direction (perpendicular to the laser resonator). A large number of multi-beam laser chips are formed in one bar. A large number of the bars are aligned and fixed to a chucking jig in a state where the facet plane faces upward as described above, and a reflection film is formed on the facet plane by using a reflection film forming apparatus. This operation is performed on the both facet planes. A reflection film structure is designed so as to obtain desired characteristics as a laser and is conformed to the design. Then, this bar is cleaved or pelletized at boundaries of the multi-beam laser chips to be separated into multi-beam laser chips so that the semiconductor laser element 1 according to this embodiment as a multi-beam laser chip is completed.

Second Embodiment

Figure 7:
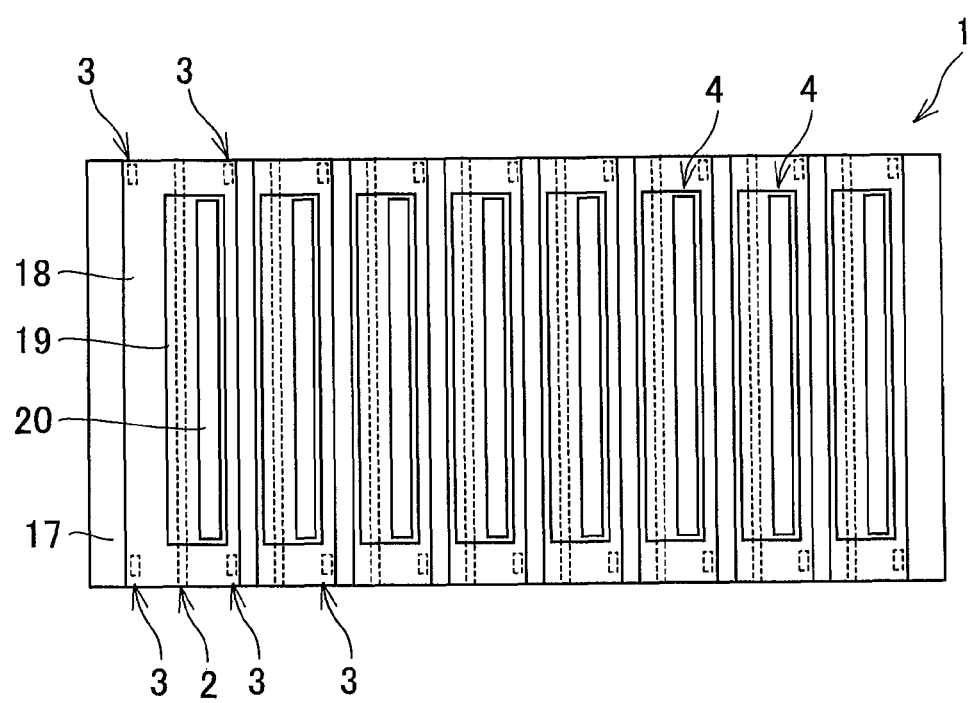
FIG. 7 is a top view illustrating a structure of a semiconductor laser element according to a second embodiment of the present invention.

A semiconductor laser element according to a second embodiment of the present invention is different from the semiconductor laser element according to the first embodiment in the structure of the short ridge portion 3, but the other parts are the same. FIG. 7 is a top view illustrating a structure of the semiconductor laser element 1 according to this embodiment.

The end of the short ridge portion 3 (second ridge semiconductor layer or third ridge semiconductor layer) on the LD facet side of the semiconductor laser element 1 according to the first embodiment reaches the LD facet. The end is aligned with the LD facet. However, this structure is not a limitation. The end of the short ridge portion 3 on the LD facet side of the semiconductor laser element 1 according to this embodiment is positioned inside the LD facet. It is desired that the distance between the end and the LD facet be 1 µm to 30 µm, for example.

In this embodiment, the height of the end of the short ridge portion 3 on the LD facet side is larger than the height of the light emitting ridge portion 2 at the LD facet. Therefore, similarly to the first embodiment, the risk of mechanical damage to the light emitting ridge portion 2 is increased, but the effect of suppressing the risk by the short ridge portion 3 can be obtained.

Also in this embodiment, a thick film electrode may be formed also on the upper part of the short ridge portion 3 (above the second ridge semiconductor layer and above the third ridge semiconductor layer). Because the end of the short ridge portion 3 on the LD facet side according to this embodiment is positioned inside the LD facet, even if the thick film electrode is formed on the upper part of the short ridge portion 3, influence of cleavage of the LD facet is reduced, and a defect of the thick film electrode of the short ridge portion 3 due to cleavage can be suppressed.

Third Embodiment

Figure 8:
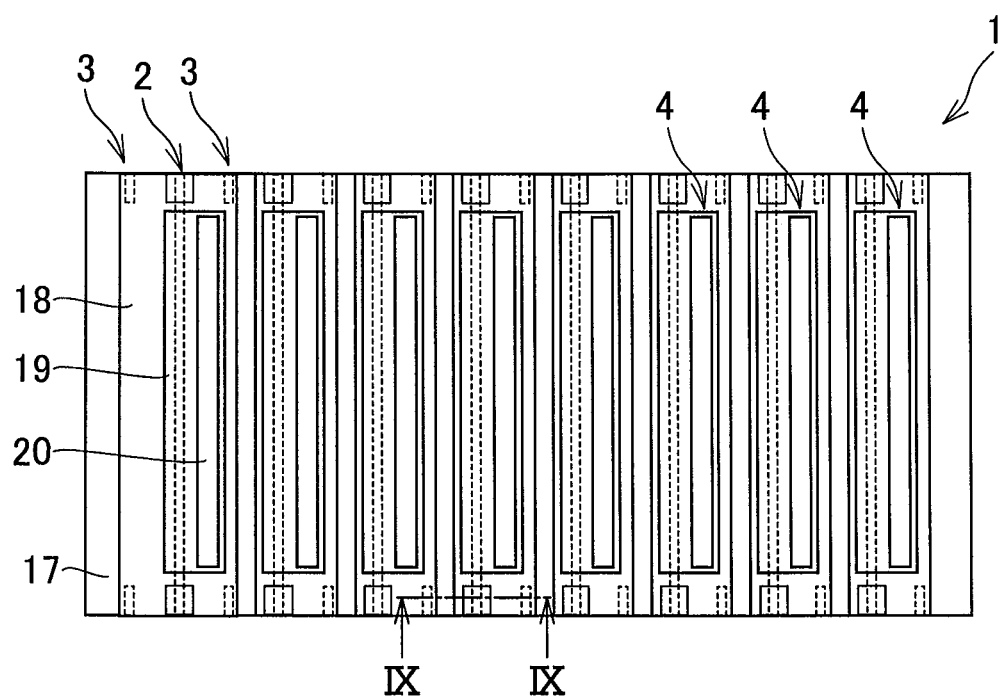
FIG. 8 is a top view illustrating a structure of a semiconductor laser element according to a third embodiment of the present invention.
Figure 9:
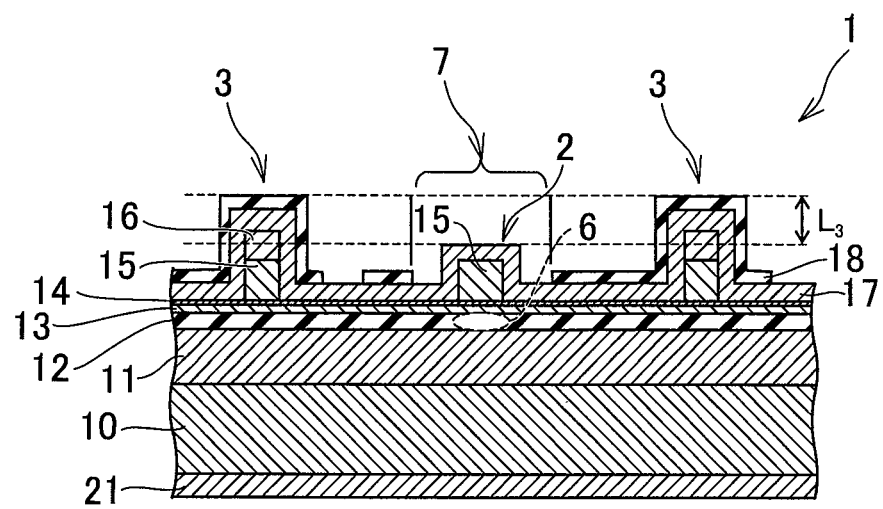
FIG. 9 is a cross-sectional view of the semiconductor laser element according to the third embodiment of the present invention.

A semiconductor laser element according to a third embodiment of the present invention is different from the semiconductor laser element according to the first or second embodiment in the structure of the light emitting ridge portion 2 in the vicinity of the LD facet, but the other parts are the same. FIG. 8 is a top view illustrating a structure of the semiconductor laser element 1 according to this embodiment, and FIG. 9 is a cross-sectional view of the semiconductor laser element 1 according to this embodiment. FIG. 9 illustrates a cross section taken along the line IX-IX of FIG. 8. In the semiconductor laser element 1 according to this embodiment, in the vicinity of the LD facet, the p-type electrode layer 18 is removed from the light emitting ridge portion 2. In other words, the p-type electrode layer 18 formed on the upper part of the light emitting ridge portion 2 (above the first ridge semiconductor layer) does not reach the LD facet. FIG. 9 illustrates the region from which the p-type electrode layer 18 is removed as an electrode removed area 7. The electrode removed area 7 is a region including the first ridge semiconductor layer so as to expand on both sides within a predetermined distance from the LD facet. In this case, the predetermined distance is 7 µm to 15 µm. The height of the end of the short ridge portion 3 on the LD facet side of the semiconductor laser element 1 according to this embodiment is larger than the height of the light emitting ridge portion 2 at the LD facet by a length $L_3$. Because the p-type electrode layer 18 is removed from the light emitting ridge portion 2, a height difference (length $L_3$) between the short ridge portion 3 and the light emitting ridge portion 2 can be further increased compared with the first or second embodiment. Thus, the effect of suppressing the mechanical damage to the light emitting ridge portion 2 can be further improved. Note that, FIG. 8 illustrates a case where the end of the short ridge portion 3 on the LD facet side reaches the LD facet corresponding to the first embodiment. However, this is not a limitation, and the end of the short ridge portion 3 on the LD facet side may be positioned inside the LD facet corresponding to the second embodiment.

A method of manufacturing the semiconductor laser element 1 according to this embodiment includes, in the method of manufacturing the semiconductor laser element 1 according to the first embodiment, a step of removing the p-type electrode layer 18 formed in the electrode removed area 7.

This step is performed after the step of forming the p-type thick film electrode (first thick film electrode 19 and second thick film electrode 20). Using a photolithography and etching process, the p-type electrode layer 18 formed in the electrode removed area 7 is removed. After that, the photoresist is removed. In the electrode removed area 7, it is desired that the end on the LD facet side reach the LD facet while the inner end (opposite to the end on the LD facet side) be located at a position of approximately 7 µm to approximately 15 µm from the LD facet. The other steps than this step are the same as the method of manufacturing the semiconductor laser element 1 according to the first embodiment. Note that, in the step of forming the p-type electrode layer 18 into a predetermined shape in the method of manufacturing the semiconductor laser element 1 according to the first embodiment, the p-type electrode layer 18 formed in the electrode removed area 7 may be removed.

The p-type electrode layer 18 is removed in the light emitting ridge portion 2 in the vicinity of the LD facet in the semiconductor laser element 1 according to this embodiment, but on the contrary, the p-type electrode layer 18 may be removed at the short ridge portion 3. Because the p-type contact layer 16 is removed from the light emitting ridge portion 2 (first ridge semiconductor layer) in the vicinity of the LD facet, even if the p-type electrode layer 18 of the short ridge portion 3 is removed, the height of the end of the short ridge portion 3 on the LD facet side can be made larger than the height of the light emitting ridge portion 2 at the LD facet.

Fourth Embodiment

Figure 10:
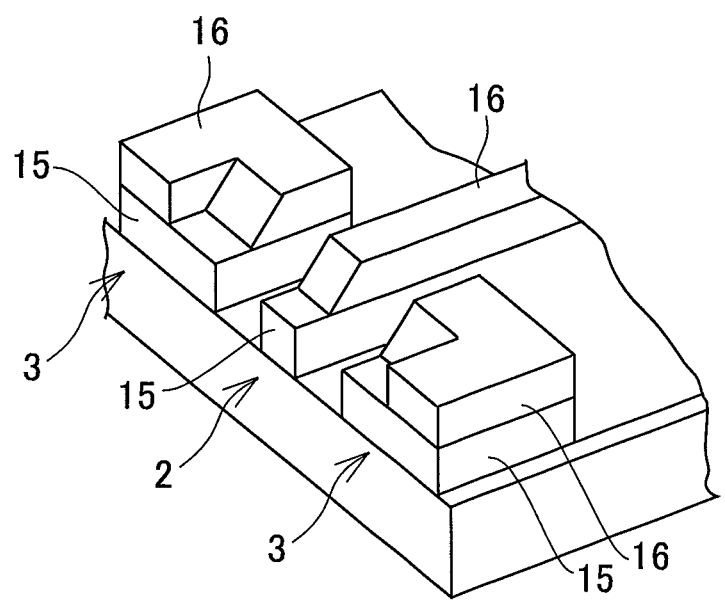
FIG. 10 is a schematic view illustrating a structure of a semiconductor laser element according to a fourth embodiment of the present invention.

A semiconductor laser element according to a fourth embodiment of the present invention is different from the semiconductor laser element according to any one of the first to third embodiments in the structure of the short ridge portion 3, but the other parts are the same. FIG. 10 is a schematic view illustrating a structure of the semiconductor laser element 1 according to this embodiment. In order to simply describe the structure of the short ridge portion 3, FIG. 10 does not illustrate the insulating oxide film 17, the p-type electrode layer 18, and the like.

In the first to third embodiments, the semiconductor layer (second ridge semiconductor layer and third ridge semiconductor layer) of the short ridge portion 3 extends from the end on the LD facet side to the inner end with a predetermined width, but this is not a limitation. The p-type contact layer 16 may be removed in a partial region along the width direction of the ridge. In two short ridge portions 3 illustrated in FIG. 10, the p-type contact layer 16 is removed in the region of a predetermined distance from the LD facet in a part of the light emitting ridge portion 2 side adjacent between the short ridge portions 3. It should be understood that this is not a limitation.

Figure 11:
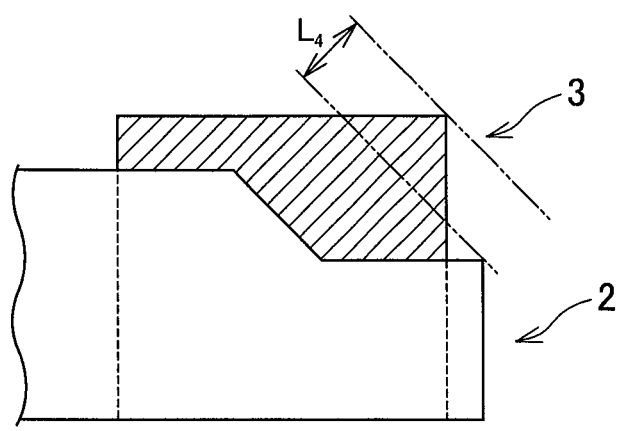
FIG. 11 is a conceptual diagram illustrating a structure of the semiconductor laser element according to the present invention.

FIG. 11 is a conceptual diagram illustrating a structure of the semiconductor laser element 1 according to the present invention. FIG. 11 schematically illustrates a cross section of the light emitting ridge portion 2 and the short ridge portion 3 of the semiconductor laser element according to the present invention, which is a cross section including the resonator direction and the lamination direction of the semiconductor multilayer. Because the short ridge portion 3 is arranged, mechanical damage to the light emitting ridge portion 2 can be suppressed. In order to obtain the effect of suppressing mechanical damage to the light emitting ridge portion 2, as described above, it is not always necessary that the end of the short ridge portion 3 (second ridge semiconductor layer or third ridge semiconductor layer) on the LD facet side reach the LD facet but may be positioned inside the LD facet. The height of the end of the short ridge portion 3 on the LD facet side is larger than the height of the light emitting ridge portion 2 at the LD facet. However, the height of the end of the short ridge portion 3 on the LD facet side is not always required to be larger than the height of the light emitting ridge portion 2 at the LD facet over the entire end of the short ridge portion 3 in the width direction. The height is sufficient to be larger in a part of the end in the width direction.

For instance, in the step of coating a division surface (LD facet) of the plurality of semiconductor laser elements 1 cleaved into bars with the reflection film, it is desired that even if the bar is inclined, the short ridge portion 3 prevent the upper part of the light emitting ridge portion 2 from contacting with the plane of the jig. In other words, with respect to the plane of the jig, it is desired that the uppermost point of the end of the short ridge portion 3 on the LD facet side be larger than the uppermost point of the light emitting ridge portion 2 at the LD facet. Considering a severe condition than the supposed flat surface of the jig, and then supposing a plane crossing the plane of the LD facet with an angle of 45 degrees, it is desired that with respect to this plane, the uppermost point of the end of the short ridge portion 3 on the LD facet side be larger than the uppermost point of the light emitting ridge portion 2 at the LD facet. In FIG. 11, the plane is indicated by a double-dotted dashed line, and the height difference is indicated as the length $L_4$.

Fifth Embodiment

Figure 12:
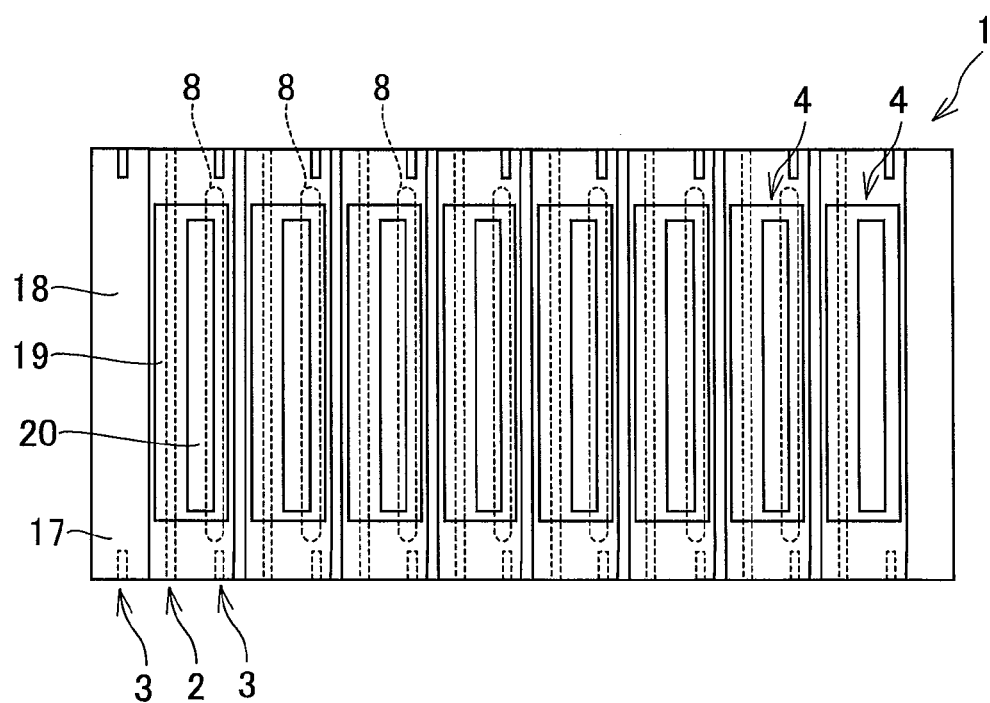
FIG. 12 is a top view illustrating a structure of a semiconductor laser element according to a fifth embodiment of the present invention.

A semiconductor laser element according to a fifth embodiment of the present invention is different from the semiconductor laser element according to any one of the first to fourth embodiments in the structure of the upper surface of the first semiconductor multilayer, but the other parts are the same. FIG. 12 is a top view illustrating a structure of the semiconductor laser element 1 according to this embodiment. In the semiconductor laser elements 1 according to the first to fourth embodiments, in the entire region in which the first ridge semiconductor layer, the second ridge semiconductor layer, and the third ridge semiconductor layer are not formed, the top surface of the semiconductor layer of the semiconductor laser element 1 is the upper surface of the first semiconductor multilayer (upper surface of the etching stop layer 14) and is a flat surface. In contrast, seven isolation trenches 8 are formed in the upper surface of the first semiconductor multilayer of the semiconductor laser element 1 according to this embodiment. The isolation trench 8 is formed by removing the upper surface of the first semiconductor multilayer in the region for forming the isolation trench 8. It is desired that a depth of the isolation trench 8 be lower than the lower surface of the active layer 12. Because a predetermined resistance of the structure of the semiconductor layer is present between beams (between neighboring light emitting ridge portions 2), cross talk is suppressed. However, because the isolation trench 8 is formed, cross talk generated between neighboring beams is further suppressed so that element characteristics can be further improved. As used herein, the cross talk means a phenomenon that a beam is affected by ON/OFF of another beam neighboring the beam so that an optical output or temperature of the beam is slightly changed. Each isolation trench 8 is formed in each region between two neighboring light emitting ridge portions 2. The front end of the isolation trench 8 according to this embodiment is positioned inside the inner end of the short ridge portion 3 on the front side (front ridge portion), and the rear end of the isolation trench 8 is positioned inside the inner end of the short ridge portion 3 on the rear side (rear ridge portion). However, without being limited to this structure, both side ends of the isolation trench 8 may reach the LD facets if there is a sufficient region between the two neighboring light emitting ridge portions 2.

In addition, it is desired that the depth of the isolation trench 8 be as shallow as possible for isolating the active layer 12. In this embodiment, the depth of the isolation trench 8 is approximately 1 μm. The region in which the isolation trench 8 is arranged may overlap with the region in which the support electrode portion 4 (part of the double plating structure) is arranged, or may not overlap therewith. In addition, one of the region in which the isolation trench 8 is arranged and the region in which the support electrode portion 4 is arranged may include the other region. The isolation trench 8 and the support electrode portion 4 are arranged independently because of the structure and the laser function.

In addition, the depth of the isolation trench 8 is small compared with the p-type electrode (p-type electrode layer 18, first thick film electrode 19, and second thick film electrode 20) formed in the support electrode portion 4. Therefore, even if a part of the region in which the support electrode portion 4 is arranged overlaps with the region in which the isolation trench 8 is arranged, the flat part of the upper surface of the support electrode portion 4 is not so affected. However, if the flat part of the upper surface of the support electrode portion 4 is affected in a case where the isolation trench 8 is formed deep, it is necessary to secure a sufficient region in the region in which the support electrode portion 4 is arranged, which does not overlap with the region in which the isolation trench 8 is arranged.

Sixth Embodiment

Figure 13:
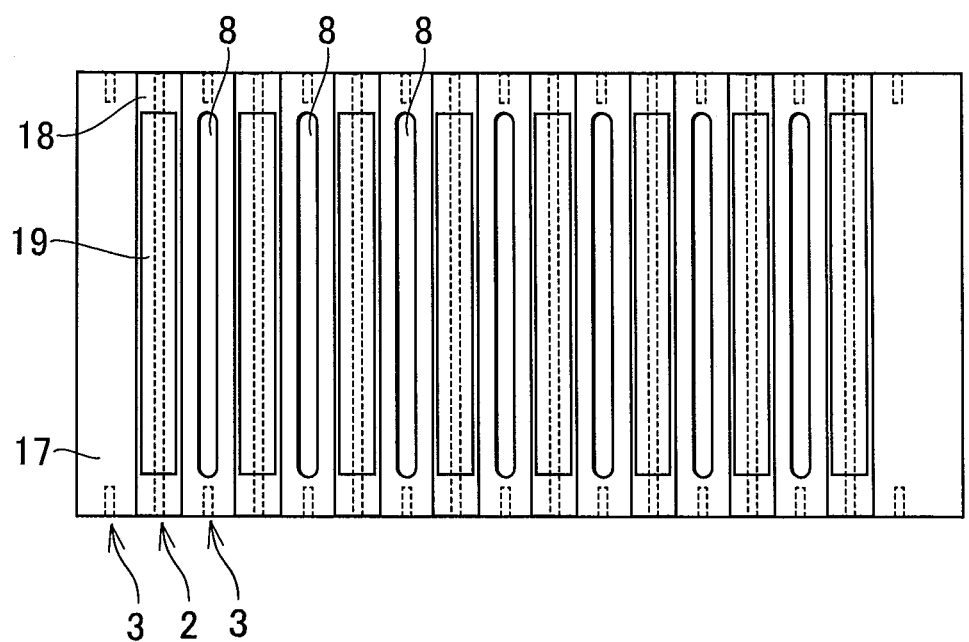
FIG. 13 is a top view illustrating a structure of a semiconductor laser element according to a sixth embodiment of the present invention.

In the semiconductor laser element 1 according to the present invention, the short ridge portion 3 is arranged instead of the bank structure so as to secure the vacant space inside, and the support electrode portion 4 is arranged in the vacant space. However, what is arranged in the vacant space is not limited to the support electrode portion 4. FIG. 13 is a top view illustrating a structure of a semiconductor laser element according to a sixth embodiment of the present invention. Unlike the semiconductor laser element 1 according to the present invention, the semiconductor laser element illustrated in FIG. 13 is not provided with the support electrode portion 4, and the isolation trench 8 is arranged in the vacant space. Each of both side ends of the isolation trench 8 is arranged inside the inner end of the short ridge portion 3. In addition, because the support electrode portion 4 is not arranged, the second thick film electrode 20 is not formed. A predetermined shape of the p-type electrode layer 18 and a predetermined shape of the first thick film electrode 19 illustrated in FIG. 13 are formed so as to cover the upper surface of the first ridge semiconductor layer. The semiconductor laser element is mounted on the submount with the bonding region that is a region above the first ridge semiconductor layer.

Seventh Embodiment

Figure 14:
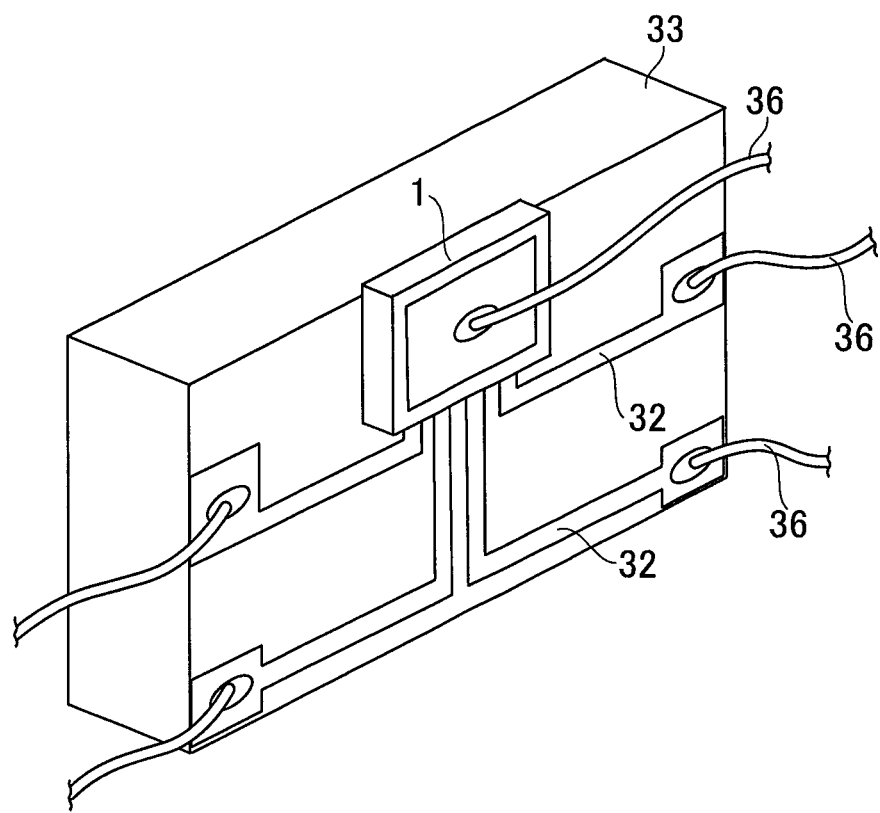
FIG. 14 is a perspective view illustrating a structure of a main part of a semiconductor laser device according to a seventh embodiment of the present invention.

A semiconductor laser device according to a seventh embodiment of the present invention includes the semiconductor laser element 1 according to any one of the first to sixth embodiments. Note that, a four-beam semiconductor laser device is described herein for simplification. Therefore, the semiconductor laser element 1 includes four light emitting portions 6 (light emitting ridge portions 2), but it should be understood that the semiconductor laser element 1 may include eight light emitting portions (light emitting ridge portions 2) or may be another type of multi-beam semiconductor laser element. FIG. 14 is a perspective view illustrating a structure of a main part of the semiconductor laser device according to this embodiment. The patterned submount electrodes 32 are formed on the chip mount surface of the submount 33 in accordance with the number of beams of the semiconductor laser element 1. Each submount electrode 32 is formed into a predetermined shape to be electrically connected to the corresponding light emitting ridge portion 2 of the semiconductor laser element 1 while including the bonding region with the corresponding support electrode portion 4, wiring, a wire bonding pad, and the like. In other words, the submount electrode 32 electrically connects the bonding region with the corresponding support electrode portion 4 and the wire bonding pad with the wiring. The wire bonding pad of the submount electrode 32 and a lead 45 to be described later (see FIG. 15) are connected via a wire 36 made of gold, for example. In addition, the common electrode (n-type electrode layer 21) of the semiconductor laser element 1 and a heat block 44 to be described later (see FIG. 15) are connected via the wire 36.

Figure 15:
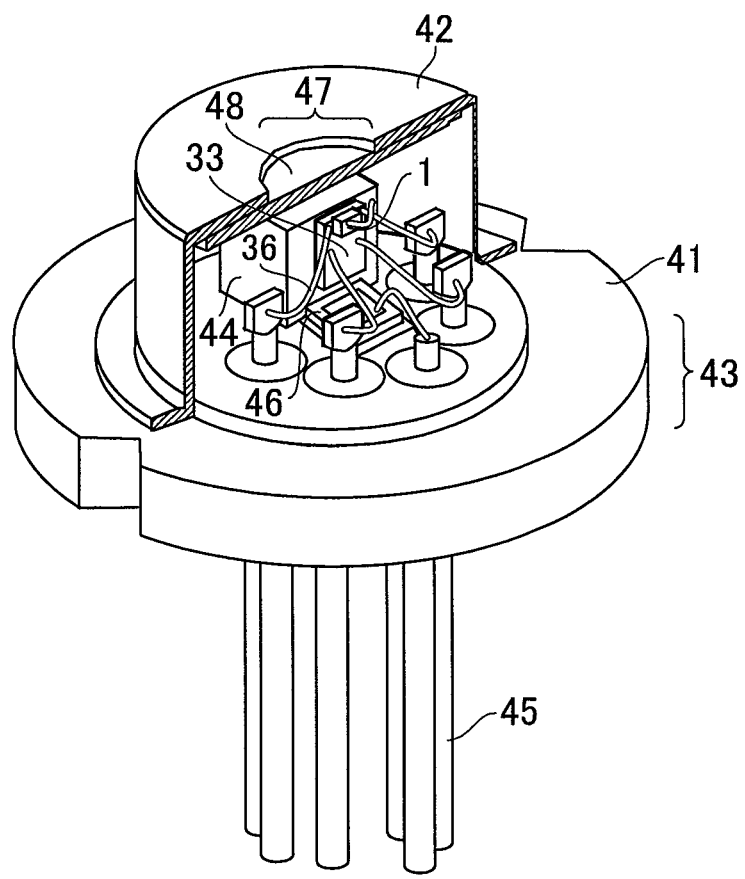
FIG. 15 is a perspective view illustrating a structure of the semiconductor laser device according to the seventh embodiment of the present invention.

FIG. 15 is a perspective view illustrating a structure of the semiconductor laser device according to this embodiment. The semiconductor laser device according to this embodiment is a four-beam semiconductor laser device and is equipped with a package (CAN sealing case) including a stem 41 and a cap 42 covering and sealing an upper part of the stem 41. The stem 41 includes a disc-like flange 43 made of a Fe alloy having a diameter of approximately 9 mm and a thickness of approximately 1 mm, for example, the heat block 44 (cubic block), the leads 45 (terminals) for electric conduction, and a photodiode chip 46. A material of the heat block 44 and the lead 45 is a Fe alloy, for example. The leads 45 are electrically isolated from a main body of the stem 41 except for a common terminal, to thereby enable independent drive of the multi-beam laser. A middle part of the upper part of the cap 42 is provided with a circular hole 47. The circular hole 47 is sealed with a glass window 48. The laser beam passes through the glass window 48 and is emitted to the outside of the package. Note that, illustration of a part of the cap 42 is omitted so that the inner structure can be seen in FIG. 15.

The heat block 44 is arranged in contact with the flange 43 and is bonded to the submount 33 with the solder material. The semiconductor laser element 1 is mounted on the submount 33, and heat generated in the semiconductor laser element 1 is dissipated to the flange 43 of the stem 41.

In addition, the photodiode chip 46 is mounted near the middle of the upper surface of the flange 43 of the stem 41 and is connected to the corresponding lead 45 with the wire 36. The semiconductor laser element 1 emits light from the LD facets on both sides, and the laser beam emitted from the rear LD facet (rear light) is used for monitoring light intensity. The light emitted from the rear LD facet of the semiconductor laser element 1 is received by the photodiode chip 46 and is further converted into a current so that front light intensity can be monitored based on the current value.

The semiconductor laser device according to this embodiment is a multi-beam semiconductor laser device, and the beams can be electrically controlled in an independent manner. Therefore, the semiconductor laser device according to this embodiment is suitable for high speed printing in a laser printer or a copying machine because a photosensitive process can be performed by a large number of scanning lines. Therefore, by using the semiconductor laser device according to this embodiment as a light source for a laser printer, a copying machine, or the like, it is possible to achieve high speed printing, high definition and higher resolution, and low cost of the laser printer, the copying machine, or the like.

The semiconductor laser elements according to the embodiments of the present invention and the semiconductor laser device including the semiconductor laser element are described above. In the semiconductor laser elements 1 according to the first to fifth embodiments, the present invention is applied to an eight-beam semiconductor laser element. The eight beams, namely the eight laser diodes (LD1 to LD8) are formed in the common process and have the same structure within manufacturing accuracy. In other words, for example, in the semiconductor laser element 1 illustrated in FIG. 2, in addition to the front ridge portion and the rear ridge portion (short ridge portions 3) on the left end, a unit of the light emitting ridge portion 2, the support electrode portion 4 adjacent on the right side thereof, the front ridge portion, and the rear ridge portion is repeated eight times in the structure. In other words, the support electrode, the front ridge portion, and the rear ridge portion are formed between the pair of neighboring light emitting ridge portions. In each pair of the light emitting ridge portions, the support electrode portion is electrically connected to the light emitting ridge portion on the same side (one side). In this case, when the both sides are referred to as "first side" and "second side", the first side indicates one of the right and left sides (for example, the left side), and the second side indicates the side other than the first side (for example, the right side). All the eight support electrode portions 4 are electrically connected to the light emitting ridge portion 2 on the first side (for example, the left side), and the height of each support electrode portion 4 is larger than the height of the light emitting ridge portion on the first side (for example, the left side). The height of the end of each front ridge portion (short ridge portion 3 on the front side) on the LD facet side is larger than the height of the light emitting ridge portion at the LD facet on the first side (for example, the left side). The same is true in each rear ridge portion (short ridge portion 3 on the rear side). As a matter of course, it is desired that all the eight laser diodes have the same structure similarly to the semiconductor laser element according to those embodiments from a viewpoint of stability of the element characteristics and a narrower beam pitch. However, it should be understood that when at least the structure between the pair of neighboring light emitting ridge portions has the above-mentioned structure, the effect of the present invention can be obtained for the corresponding light emitting ridge portion.

Note that, it should be understood that the present invention is not limited to those embodiments and can be variously modified within the scope described in the claims. The present invention is applied to the four-beam and eight-beam semiconductor laser devices in the embodiments described above, but the present invention can be generally applied to other types of multi-beam semiconductor laser device as a matter of course. In addition, in the semiconductor laser elements 1 according to the embodiments of the present invention, the surface of the laser chip on which the light emitting ridge portion 2 and the like are formed is referred to as "p-side (p-type electrode)" while the back surface is referred to as "n-side (n-type electrode)", but this structure is not a limitation as a matter of course.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A multi-beam semiconductor laser device, comprising:
   a substrate;
   a first semiconductor multilayer in which a plurality of semiconductor layers comprising an active layer are laminated on the substrate;
   a plurality of light emitting ridge portions that are formed to extend along a light emitting direction from a front end surface to a rear end surface of the substrate, and to be aligned in order on an upper surface of the first semiconductor multilayer along a direction orthogonal to the light emitting direction;
   a support electrode portion formed on the upper surface of the first semiconductor multilayer with an insulating film therebetween in a region between the front end surface and the rear end surface and between a pair of neighboring ones of the plurality of light emitting ridge portions; and
   a front ridge portion formed on the upper surface of the first semiconductor multilayer on at a front end surface side of the support electrode portion between the pair of neighboring ones of the plurality of light emitting ridge portions,
   wherein the support electrode portion is electrically connected to one of the pair of neighboring ones of the plurality of light emitting ridge portions,
   wherein a height of the support electrode portion is larger than a height of the one of the pair of neighboring ones of the plurality of light emitting ridge portions, and
   wherein a height of an end of the front ridge portion at the front end surface side is larger than a height of the one of the pair of neighboring ones of the plurality of light emitting ridge portions at the front end surface.

2. The multi-beam semiconductor laser device according to claim 1, further comprising:
   a rear ridge portion formed on the upper surface of the first semiconductor multilayer at a rear end surface side of the support electrode portion between the pair of neighboring ones of the plurality of light emitting ridge portions,
   wherein a height of an end of the rear ridge portion at the rear end surface side is larger than a height of the one of the pair of neighboring ones of the plurality of light emitting ridge portions at the rear end surface.

3. The multi-beam semiconductor laser device according to claim 1, further comprising:
   an isolation trench formed in the upper surface of the first semiconductor multilayer between the pair of neighboring ones of the plurality of light emitting ridge portions.

4. The multi-beam semiconductor laser device according to claim 1,
   wherein each of the plurality of light emitting ridge portions comprises a first ridge semiconductor layer formed on the upper surface of the first semiconductor multilayer, and
   wherein in the one of the pair of neighboring ones of the plurality of light emitting ridge portions, a height of the first ridge semiconductor layer at the front end surface is smaller than a height thereof in an inner region.

5. The multi-beam semiconductor laser device according to claim 4, wherein in the one of the pair of neighboring ones of the plurality of light emitting ridge portions, the support electrode portion is electrically connected above the first ridge semiconductor layer and the support electrode portion does not extend to the front end surface.

6. The multi-beam semiconductor laser device according to claim 4,
   wherein the front ridge portion comprises a second ridge semiconductor layer formed on the upper surface of the first semiconductor multilayer, and
   wherein a width of the second ridge semiconductor layer of the front ridge portion is equal to or smaller than a width of the first ridge semiconductor layer of the one of the pair of neighboring ones of the plurality of light emitting ridge portions.

7. The multi-beam semiconductor laser device according to claim 1,
   wherein a length of the support electrode portion is 50% or more of a distance from the front end surface to the rear end surface.

8. A multi-beam semiconductor laser device, comprising:
   a substrate;
   a first semiconductor multilayer in which a plurality of semiconductor layers comprising an active layer are laminated on the substrate;
   a plurality of light emitting ridge portions that are formed to extend along a light emitting direction from a front end surface to a rear end surface of the substrate, and to be aligned in order on an upper surface of the first semiconductor multilayer along a direction orthogonal to the light emitting direction;
   a plurality of support electrode portions each formed on the upper surface of the first semiconductor multilayer with an insulating film therebetween in a region between the front end surface and the rear end surface and between pairs of neighboring ones of the plurality of light emitting ridge portions; and
   a plurality of front ridge portions each formed on the upper surface of the first semiconductor multilayer at a front end surface side of one of the plurality of support electrode portions,
   wherein each of the plurality of support electrode portions is electrically connected to one light emitting ridge portion of one of the pairs of the plurality of light emitting ridge portions,
   wherein a height of each of the plurality of support electrode portions is larger than a height of the one of the corresponding pair of the plurality of light emitting ridge portions, and
   wherein a height of an end of each of the plurality of front ridge portions at the front end surface side is larger than a height of the one of the corresponding pair of the plurality of light emitting ridge portions at the front end surface.

9. A multi-beam semiconductor laser device, comprising:
a substrate;
a first semiconductor multilayer in which a plurality of semiconductor layers comprising an active layer are laminated on the substrate;
a plurality of light emitting ridge portions that are formed to extend along a light emitting direction from a front end surface to a rear end surface of the substrate, and to be aligned in order on an upper surface of the first semiconductor multilayer along a direction orthogonal to the light emitting direction;
an isolation trench portion formed in the upper surface of the first semiconductor multilayer in a region inside the front end surface and the rear end surface between a pair of neighboring ones of the plurality of light emitting ridge portions, the isolation trench portion isolating the active layer in between the pair of neighboring ones of the plurality of light emitting ridge portions; and
a front ridge portion formed on the upper surface of the first semiconductor multilayer at a front end surface side of the isolation trench portion between the pair of neighboring ones of the plurality of light emitting ridge portions,
wherein a height of an end of the front ridge portion at the front end surface side is larger than a height of one of the pair of neighboring ones of the plurality of light emitting ridge portions at the front end surface.

10. The multi-beam semiconductor laser device according to claim 9,
wherein the first semiconductor multilayer further includes a clad layer laminated below the active layer,
wherein a depth of the isolation trench portion is lower than a lower surface of the active layer and the isolation trench portion reaches the clad layer.

11. The multi-beam semiconductor laser device according to claim 9, further comprising:
a support electrode portion formed on the upper surface of the first semiconductor multilayer structure,
wherein a depth of the isolation trench portion is less than a height of the support electrode portion.

* * * * *